US 6,956,167 B2

(12) United States Patent
Kurihara et al.

(10) Patent No.: US 6,956,167 B2
(45) Date of Patent: Oct. 18, 2005

(54) LID-HOLDING FRAME USED IN PRODUCTION OF HOLLOW-PACKAGE TYPE ELECTRONIC PRODUCTS, AND SEALING-PROCESS USING SUCH LID-HOLDING FRAME

(75) Inventors: Toshimichi Kurihara, Kawasaki (JP); Takashi Ueda, Ohtsu (JP)

(73) Assignee: NEC Compound Semiconductor Devices, Ltd. (JP)

( * ) Notice: Subject to any disclaimer, the term of this patent is extended or adjusted under 35 U.S.C. 154(b) by 5 days.

(21) Appl. No.: 10/623,952

(22) Filed: Jul. 21, 2003

(65) Prior Publication Data

US 2004/0042187 A1 Mar. 4, 2004

(30) Foreign Application Priority Data

Aug. 26, 2002 (JP) ........................................ 2002-245400

(51) Int. Cl.⁷ ............................................ H01L 23/02
(52) U.S. Cl. .................. 174/52.5; 174/50.5; 174/50.56; 361/681
(58) Field of Search ............................... 174/52.5, 50.5, 174/50.51, 50.54, 50.55, 50.56, 52.2, 52.3; 361/760, 761, 767, 681

(56) References Cited

U.S. PATENT DOCUMENTS

| 3,211,827 A | * | 10/1965 | Trueb et al. ................ 174/52.5 |
| 3,775,645 A | * | 11/1973 | McCarthy .................... 257/708 |
| 3,988,196 A | | 10/1976 | Wanesky ..................... 156/541 |
| 5,181,604 A | * | 1/1993 | Ohta et al. ................... 206/5.1 |
| 5,889,323 A | | 3/1999 | Tachibana ................... 257/704 |
| 6,816,213 B2 | * | 11/2004 | Kato et al. .................... 349/58 |
| 2002/0089097 A1 | | 7/2002 | Silberbrook ................ 264/496 |

FOREIGN PATENT DOCUMENTS

| JP | 06-069366 | 3/1994 | .......... H01L/23/08 |
| JP | 2000-183204 | 6/2000 | .......... H01L/23/02 |
| JP | 2001-196488 | 7/2001 | .......... H01L/23/08 |

* cited by examiner

Primary Examiner—Dhiru R. Patel
(74) Attorney, Agent, or Firm—Hayes Soloway P.C.

(57) ABSTRACT

A lid-member holder is used to define envelopers encapsulating electronic components in production of hollow-package type electronic products. A plurality of lid members are temporarily held by the holder body. The lid members are arranged so as to be consistent with an arrangement of surrounding wall members, which are to be sealed with the lid members in a lump to define the envelopers, and the temporary holding of the lid members by the holder body is realized such that lid members can be separated from the lid members after the surrounding wall members are completely sealed with the lid members, without the lid members being removed from the surrounding wall members.

27 Claims, 15 Drawing Sheets

LID-HOLDING FRAME USED IN PRODUCTION OF HOLLOW-PACKAGE TYPE ELECTRONIC PRODUCTS, AND SEALING-PROCESS USING SUCH LID-HOLDING FRAME

BACKGROUND OF THE INVENTION

1. Field of the Invention

The present invention generally relates to production of electronic products, and more particularly relates to production of hollow-package type electronic products, each of which has a hollow space for accommodating an electronic component therein.

2. Description of the Related Art

Among electronic products, there are electronic packages, each of which includes a plate-like mount, an electronic component mounted on the plate-like mount, a plurality of leads electrically connected to the electronic component, and an enveloper for encapsulating the electronic component together with inner lead sections of the leads, to thereby protect the electronic component from the outside. The lead elements pass and extend through the enveloper, and an outer lead section of each lead serves as an electrode terminal for the electronic package.

When the electronic component includes a high power transistor, such as a power MOSFET or the like, which is frequently utilized in an analog amplifier or the like, a large amount of heat is generated from the electronic component during the operation of the electronic package. Thus, when the electronic component includes the high power transistor, the plate-like mount, on which the electronic component is mounted, is formed as a heat radiating plate, which is made of a suitable metal material, such as copper, brass, stainless steel, aluminum or the like, to thereby facilitate radiation of heat from the electronic component.

When the envelopes for encapsulating the electronic component is formed of a suitable thermosetting resin, the electronic package is frequently called a resin-sealed package. Conventionally, the resin-sealed package may be manufactured as explained below.

The electronic component is mounted on and adhered to the plate-like mount or heat radiating plate, such that electrode pads of the electronic component, provided on a bottom face thereof, are electrically connected to the heat radiating plate. Also, the electronic component is provided with electrode pads provided on a top face thereof, and the respective electrode pads are connected to the inner lead sections of the leads through the intermediary of bonding-wires. Thereafter, the electronic component and the inner lead sections are put in a molding cavity of a metal mold, and then sealing-resin is injected into the molding cavity, whereby the electronic component and the inner lead sections are enclosed with and encapsulated in the molded resin, with the outer lead sections of the leads being protruded from the molded resin as the electrode terminals. Thus, in the resin-sealed package, the electronic component and the inner lead sections are in direct contact with the molded resin.

When the electronic component includes the high power transistor, it generates a very large amount of heat during the operation of the resin-sealed package, and thus the molded resin may be subjected to deterioration and exfoliation. In this case, the characteristics of the resin-sealed package are changed, resulting in a decline in the operational reliability.

Also, as stated above, since the molded resin is in direct contact with the electronic component and the inner lead sections, it may serve as a dielectric layer, resulting in production of a parasitic capacitance. Accordingly, due to the interference based on the production of the parasitic capacitance, the frequency characteristics of the resin-sealed package may be deteriorated in a high-frequency band of more than 1 GHz. In particular, the deterioration of the high-frequency characteristics causes serious problems in microwave applications of the resin-sealed package.

A hollow-package type electronic product is well known as an electronic package which is not subject to the above-mentioned problems involved in the resin-sealed package, and is frequently represented by a ceramic package, a metal package or the like. Also, the hollow-package type electronic product is disclosed in, for example, Japanese Laid-Open Patent Publications (KOKAI) No. HEI-06-069366, No. 2000-183204, No. 2001-196488 and No. 2001-044228.

For example, in producing the hollow-package type electronic product, the electronic component is mounted on and adhered to the heat radiating plate, such that the bottom electrode pads of the electronic component are electrically connected to the heat radiating plate. Then, a surrounding wall member is securely attached to the heat radiating plate such that the electronic component is encompassed by the surrounding wall member. Thereafter, the leads are put on tops of opposite side wall sections of the surrounding wall member, and the respective top electrode pads are connected to the inner lead sections of the leads through the intermediary of bonding-wires. After the electrical connections of the top electrode pads to the inner lead sections of the lead are finished, a lid member is securely adhered to the top end face of the surrounding wall member, resulting in production of the hollow-package type electronic product in which the electronic component is accommodated and sealed in the hollow space defined by the surrounding wall member and the lid member, with the outer lead sections of the leads being protruded from the interface between the surrounding wall member and the lid member.

Note, although both the surrounding wall member and the lid member are made of either a suitable ceramic material (ceramic package) or a suitable metal material (metal package), another suitable material, such as thermosetting resin, a composite rein material or the like may be used for the surrounding wall member and the lid member.

As stated above, since the electronic component is accommodated and sealed in the hollow space defined by the surrounding wall member and the lid member, the hollow-package type electronic product is not subject to the above-mentioned problems involved in the resin-sealed package. Nevertheless, conventionally, it has not been proposed how to produce a large quantity of hollow-package type electronic products efficiently and at low cost.

SUMMARY OF THE INVENTION

Therefore, an object of the present invention is to provide a lid-member holder used to define envelopers encapsulating electronic components in production of hollow-package type electronic products, so that a large quantity of hollow-package type electronic products can be efficiently produced at low cost.

Another object of the present invention is to provide a sealing process for sealing a plurality of surrounding wall members with a plurality of lid-members, using the aforesaid lid-member holder, to thereby efficiently define the envelopers encapsulating electronic components in production of the hollow-package type electronic products.

In accordance with a first aspect of the present invention, there is provided a lid-member holder used to define envelopers encapsulating electronic components in production of hollow-package type electronic products. The lid-member holder comprises a holder body, and a plurality of lid members temporarily held by the holder body. The lid members are arranged so as to be consistent with an arrangement of surrounding wall members, which are to be sealed with the lid members in a lump to define the envelopers, and the temporary holding of the lid members by the holder body is realized such that the holder body can be separated from the lid members after the surrounding wall members are completely sealed with the lid members, without the lid members being removed from the surrounding wall members.

The lid members may be molded from a suitable resin material, using a metal mold in which the holder body is incorporated, such that the temporary holding of the lid members by the holder body is achieved when the molding of the lid members is completed.

A surface of the holder body may be subjected to a rough surface treatment, and the molded lid members are in mechanical engagement with the treated rough surface of the holder body, whereby the temporary holding of the lid members by the holder body is achieved by the mechanical engagement between the molded lid members and the treated rough surface of the holder body. In this case, the holder body may be formed with a plurality of openings which are closed by the lid members, and a size of the openings is controlled to thereby regulate a holding force with which the lid members are held by the holder body. Optionally, a roughness of the treated rough surface of the holder body may be controlled to regulate a holding force with which the lid members are held by the holder body.

The holder body may be formed with a plurality of openings arranged so as to be consistent with the arrangement of the surrounding wall members, and each of the molded lid members has a stub portion which is in mechanical engagement with an inner peripheral wall surface of a corresponding one of the openings, whereby the temporary holding of the lid members by the holder body is achieved by the mechanical engagement between the molded lid members and the inner peripheral wall surfaces of the openings. In this case, a contact area between the opening and the stub portion corresponding to each other may be controlled to thereby regulate a holding force with which the lid members are held by the holder body.

Each of the lid members may further have a thin flange element integrally and radially extended from a top surface of the stub portions, and the respective stub portions with the thin flange elements are fitted into the openings such that each of the thin flange elements is in close contact with a surface of the holder body, which surrounds a corresponding opening, whereby the temporary holding of the lid members by the holder body is achieved by the stub portions with the thin flange elements. In this case, a thickness of the thin flange elements may be controlled to thereby regulate a holding force with which the lid members are held by the holder body.

The holder body may have a plurality of spike elements arranged so as to be consistent with the arrangement of the surrounding wall members, and each of the molded lid members is penetrated by a corresponding spike element, whereby the temporary holding of the lid members by the holder body is achieved by the penetration of the spike elements into the molded lid members. In this case, a configuration of the spike elements may be controlled to thereby regulate a holding force with which the lid members are held by the holder body.

The holder body may be made of a suitable resin material which is different from the resin material for the lid members, and the temporary holding of the lid members by the holder body is achieved by an adhesive force acting on interfaces between the plate-like holder body and the molded lid members. In this case, a surface of the holder body is subjected to a rough surface treatment, and the molded lid members are in mechanical engagement with the treated rough surface of the holder body, whereby the temporary holding of the lid members by the holder body is further achieved by the mechanical engagement between the molded lid members and the treated rough surface of the holder body in addition to the adhesive force acting on the interfaces between the plate-like holder body and the molded lid members. Optionally, a roughness of the treated rough surface of the holder body may be controlled to thereby regulate a holding force with which the lid members are held by the holder body.

The holder body may be made of a suitable resin material, and is formed with a plurality of openings arranged so as to be consistent with the arrangement of the surrounding wall members, and a plurality of radial needle elements are integrally and inwardly protruded from an inner peripheral wall face of each opening such that each of the molded lid members is mechanically engaged with the radial needle elements of a corresponding opening, whereby the temporary holding of the lid members by the holder body is achieved by the mechanical engagement between each molded lid member and the radial needle elements of each opening. In this case, a number of the radial needle elements of each opening may be controlled to thereby regulate a holding force with which the lid members are held by the holder body. Also, a thickness of the radial needle elements may be controlled to thereby regulate a holding force with which the lid members are held by the holder body.

The lid members may be made of a suitable material except for a resin material, and the temporary holding of the lid members by the holder body is achieved by adhering the lid members to the holder body with a suitable adhesive resin.

The sealing of the respective surrounding wall members with the lid members may be achieved by adhering the respective lid members to the surrounding wall members with a suitable adhesive resin.

On the other hand, the sealing of the respective surrounding wall members with the lid members may be achieved by coupling the respective lid members to the surrounding wall members in an interference fit manner. In this case, each of the lid members may be formed with a recess for receiving a top end of a corresponding surrounding wall member, with a size of the recess being somewhat smaller than that of the top end of the surrounding wall member at a usual ambient temperature, and a material of the lid member having a coefficient of thermal expansion larger that of the surrounding wall member. Also, each of the lid members may be formed with a bulged portion for inserting it into a top end opening of a corresponding surrounding wall member, with a size of the bulged portion being somewhat larger than that of the top end opening of the surrounding wall member at a usual ambient temperature, and a material of the lid member having a coefficient of thermal expansion smaller that of the surrounding wall member.

Each of the lid members may be provided with an additional function which is obtained by processing the lid members in a lump, with the lid members being temporarily held by the holder body. For example, the additional function may be an electromagnetic shield which is obtained from an electrically-conductive layer formed on each of the lid members.

In accordance with a second aspect of the present invention, there is provided a sealing process for sealing a plurality of surrounding wall members with a plurality of lid members to define envelopers encapsulating electronic components in production of hollow-package type electronic products. The sealing process comprises the steps of preparing an arrangement of the surrounding wall members, preparing a holder body carrying the lid members temporarily held thereby, with the lid members being arranged so as to be consistent with the arrangement of the surrounding wall members, positioning the respective lid members, held by the holder body, with respect to the surrounding wall members so as to be aligned and registered with each other, attaching the respective lid members to the surrounding wall members in a lump to thereby seal the surrounding wall member with the lid member, resulting in the definition of the envelopers, and separating the holder body from the lid members after the completion of the sealing of the surrounding wall members with the lid members, without the lid members being removed from the surrounding wall members.

The sealing of the surrounding wall members with the lid members may be achieved by adhering the respective lid members to the surrounding wall members with a suitable adhesive agent.

On the other hand, the sealing of the surrounding wall members with the lid members may be achieved by coupling the respective lid members to the surrounding wall members in an interference fit manner.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Figure 1:
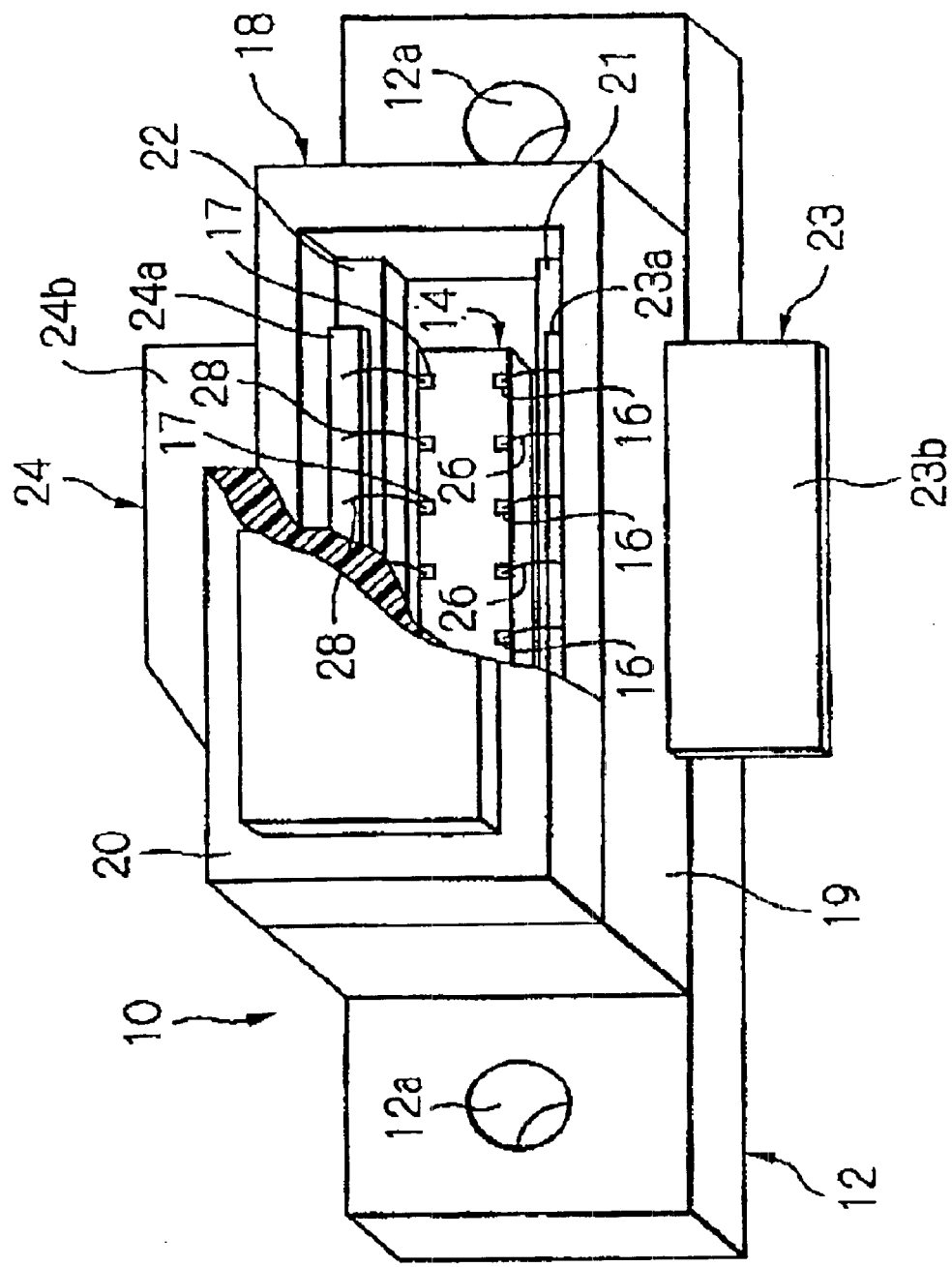
FIG. 1 is a partially-cutaway perspective view of a representative hollow-package type electronic product.

With reference to FIG. 1, a hollow-package type electronic product is representatively illustrated, and is generally indicated by reference 10.

As shown in FIG. 1, the hollow-package type electronic product 10 comprises a heat radiating plate 12 made of a suitable metal material such as copper, brass, stainless steel, aluminum or the like, and the heat radiating plate 12 is formed with a pair of screw holes 12a at the ends thereof. The screw holes 12a are used for attaching the electronic product 10 to a suitable base frame, such as an aluminum chassis or the like, by screws (not shown), when being assembled in a piece of electronic equipment.

Also, the electronic product 10 comprises an electronic component 14 mounted on and adhered to the heat radiating plate 12. In this embodiment, the electronic component 14 includes a power MOSFET as a high power transistor, is which is utilized in an analog amplifier or the like, and is provided with three sets of electrode pads: first, second and third sets of electrode pads.

In particular, as shown in FIG. 1, the first set of electrode pads, indicated by reference 16, is provided on a top face of the electronic component 14, and forms a drain of the power MOSFET. Similarly, the second set of electrode pads, indicated by reference 17, is provided on the top face of the electronic component 14, and forms a gate of the power MOSFET. The third set of electrode pads is provided on a bottom face of the electronic component 14 (not visible), and forms a source of the power MOSFET. When the electronic component 14 is mounted on and adhered to the heat radiating plate 12, the third set of electrode pads are electrically connected to the heat radiating plate 12, and thus the heat radiating plate 12 also serves as the source-terminal of the power MOSFET.

The electronic product 10 further comprises an enveloper 18 for encapsulating the electronic component 14 to thereby protect it from the outside. The enveloper 18 comprises a rectangular surrounding wall member 19 securely mounted on the heat radiating plate 12, and a lid member 20 securely attached to a top end face of the surrounding wall member 19. Both the surrounding wall member 19 and the lid member 20 may be made of a suitable thermosetting resin material, such as epoxy resin or the like. The surrounding wall member 19 is formed by a molding process, and is adhered to the heat radiating plate 12 with a suitable adhesive agent. Similarly, the lid member 20 is formed by a molding process, and is adhered to the top end face of the surrounding wall member 19, to thereby close the top opening end of the frame member 19. Thus, the electronic component 14 is encapsulated in the enveloper 18, whereby it is possible to seal and protect the electronic component 14 from the outside.

As is apparent from FIG. 1, the surrounding wall member 19 is provided with a pair of shelf portions 21 and 22, which are integrally protruded from the inner wall faces of the opposite longitudinal side wall sections of the surrounding wall member 19, and which are extended between the opposite lateral side wall sections of the surrounding wall member 19.

The electronic product 10 further comprises a pair of leads 23 and 24 made of a suitable metal such as copper or the like, and the respective leads 23 and 24 pass and extend through the opposing longitudinal side wall sections of the surrounding wall member 19, as shown in FIG. 1. Each of the leads 23 and 24 is mechanically held by the corresponding longitudinal side wall section of the surrounding wall member 19 when being molded. Preferably, each of the leads 23 and 24 has perforations (not visible) formed therein, and these perforations are buried in a corresponding longitudinal side wall section of the surrounding wall member 19 when being molded, so that a firm mechanical engagement can be obtained between the respective lead 23 and 24 and the opposite longitudinal side wall sections of the surrounding wall member 19.

The lead 23 has inner and outer lead sections 23a and 23b, which are divided and defined by the corresponding longitudinal side wall section of the surrounding wall member 19. Similarly, the lead 24 has inner and outer lead sections 24a and 24b, which are divided and defined by the corresponding longitudinal side wall section of the surrounding wall member 19. Namely, the respective inner lead sections 23a and 24a are protruded from the inner wall faces of the opposing longitudinal side wall sections of the surrounding wall member 19, and the respective outer lead sections 23b and 24b are protruded from the outer wall faces of the opposing longitudinal side wall sections of the surrounding wall member 19.

As shown in FIG. 1, the respective inner lead sections 23a and 24a are laid on the shelf portions 21 and 22. The respective inner lead section 23a is electrically connected to the electrode pads 16 with bonding-wires 26 by a well known wire-bonding machine, and thus the outer lead section 23b forms the drain-terminal of the power MOSFET. Similarly, the inner lead section 24a is electrically connected to the second set of electrode pads 17 with bonding-wires 28 by the wire-bonding machine, and thus the outer lead section 24b forms the gate-terminal of the power MOSFET.

With the arrangement of the aforesaid hollow-package type electronic product 10, since the electronic component 14 is accommodated and sealed in the interior hollow space of the enveloper 18, which is defined by the surrounding wall member 19 and the lid member 20, the enveloper 18 is substantially not subject to a thermal influence based on the heat which is generated by the electronic component 14 during the operation of the hollow-package type electronic product 10.

Accordingly, it is possible to prevent the electronic component 14 and the enveloper 18 from being prematurely deteriorated.

Also, since the enveloper 18 is not in direct contact with the electrode pads 16 and 17, the bonding-wires 26 and 28, and the inner sections 23a and 24a of the leads 23 and 24, the enveloper 18 is prevented from producing a parasitic capacitance during the operation of the hollow-package type electronic product 10. Thus, the hollow-package type electronic product is not subject to interference based on the production of the parasitic capacitance.

With reference to FIGS. 2A, 2B, 2C and 2D, a conventional sealing process for sealing the surrounding wall member 19 with the lid member 20 is conceptually illustrated. Of course, this sealing process forms a part of a production process for manufacturing a plurality of hollow-package type electronic products 10 in a lump.

Figure 2A:
FIG. 2A is a schematic conceptual cross-sectional view showing a representative step of a conventional sealing process which forms a part of a production process for manufacturing a plurality of hollow-package type electronic products.

In order to manufacture the plurality of hollow-package type electronic products 10 in a lump, a plate-like substrate 12' is prepared, as shown in FIG. 2A. The plate-like substrate 12' is made of the same metal material as the heat-radiating plate 12. Namely, when each of the hollow-package type electronic products 10 is produced according to the production process, the individual heat-radiating plates 12 are derived from the plate-like substrate 12'.

As shown in FIG. 2A, a plurality of electronic components 14 are securely mounted on and adhered to the plate-like substrate 12' with a suitable adhesive agent, so as to be arranged and aligned with each other at predetermined regular intervals. Then, a plurality of surrounding wall members 19 are mounted on and adhered to the plate-like substrate 12' with a suitable adhesive agent, such that the respective electronic components 14 are encompassed by the surrounding wall members 19. Thus, the surrounding wall members 19 are arranged and aligned with each other at the same regular intervals as the electronic components 14. Thereafter, a suitable adhesive agent is applied to the top end faces of the surrounding wall members 19.

Note, in FIG. 2A, although not shown to avoid complexity of illustration, each of the surrounding wall members 19 is provided with the leads (23 and 24), and the respective inner lead sections (23a and 24a) of the leads are electrically connected to the electrode pads (16 and 17) of a corresponding electronic component 14 with the bonding-wires (26 and 28), as shown in FIG. 1.

Figure 2B:
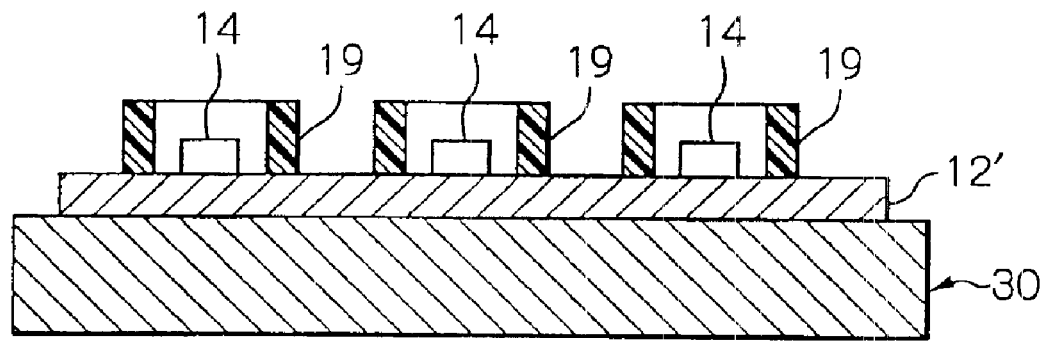
FIG. 2B is a schematic conceptual cross-sectional view showing another representative step of the conventional sealing process.

After the application of the adhesive agent to the top end faces of the surrounding wall members 19, the plate-like substrate 12' carrying the electronic components 14 and the surrounding wall members 19 are placed and set at a given location on a work-table 30 of an automatic sealing machine, as shown in FIG. 2B.

Figure 2C:
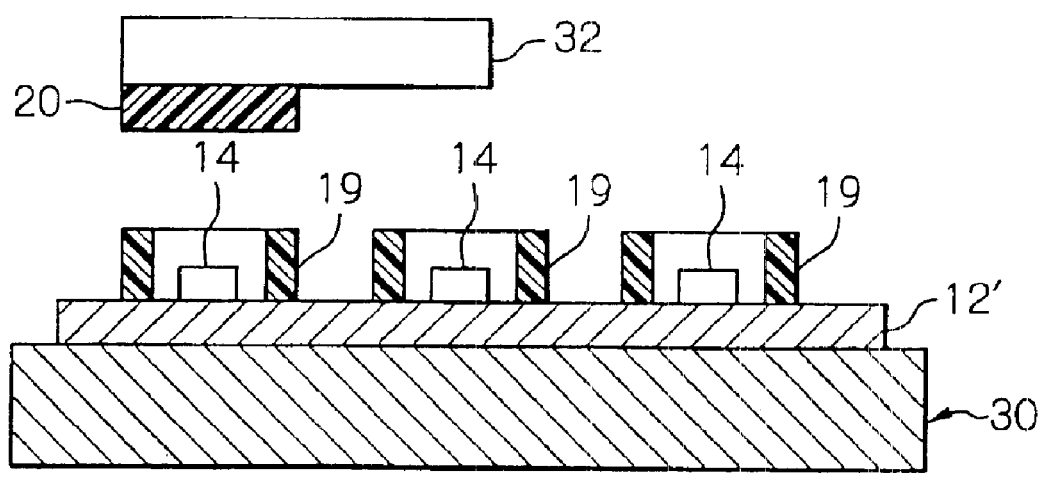
FIG. 2C is a schematic conceptual cross-sectional view showing yet another representative step of the conventional sealing process.

As symbolically shown in FIG. 2C, the automatic sealing machine is provided with a movable arm 32 having a pneumatic sucker, and a lid member 20 is sucked and held by the pneumatic sucker of the movable arm 32. The movable arm 32 is operated by a controller of the automatic sealing machine such that the lid member 20 sucked by the pneumatic sucker is carried to a position above one of the surrounding wall members 19, and is precisely positioned so as to be arranged and aligned with the surrounding wall member 19 concerned. Then, the movable arm 32 is moved down such that the lid member 20 is laid on and registered with the top end face of the surrounding wall member 19, which is coated with the adhesive agent. Subsequently, the lid member 20 is released from the pneumatic sucker of the movable arm 32, and thus the lid member 20 is put on the surrounding wall member 19 concerned, as shown in FIG. 2D.

Figure 2D:
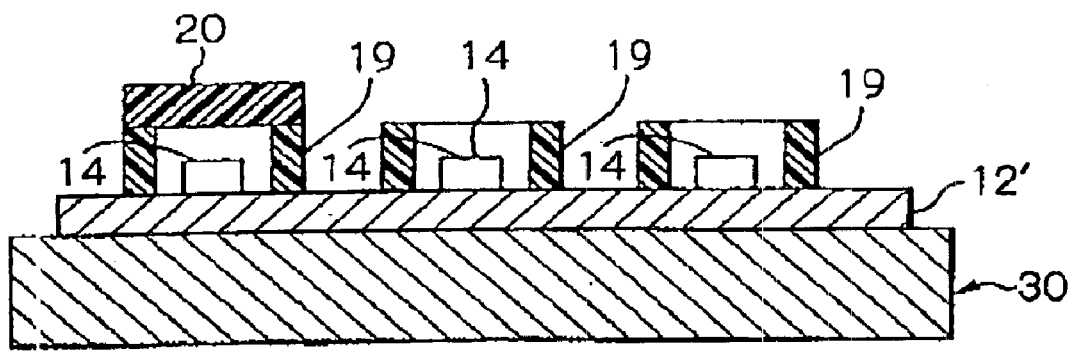
FIG. 2D is a schematic conceptual cross-sectional view showing still yet another representative step of the conventional sealing process.
Figure 2E:
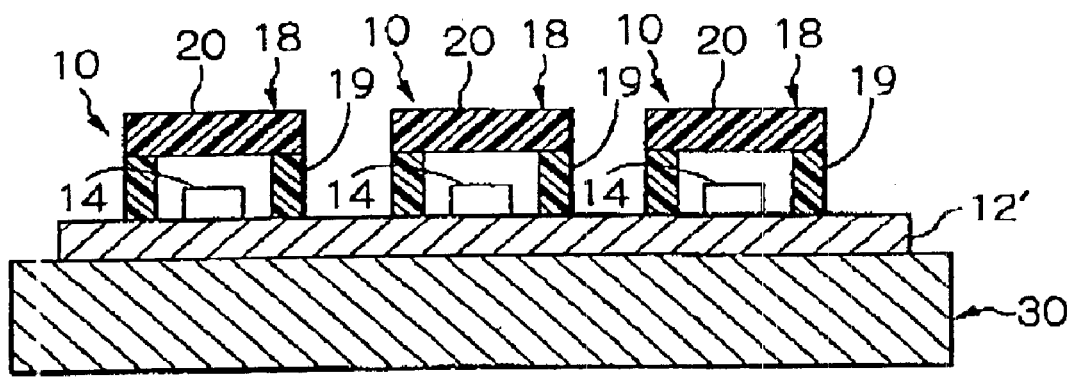
FIG. 2E is a schematic conceptual cross-sectional view showing still yet another representative step of the conventional sealing process.

The steps of FIGS. 2C and 2D are repeated until the lid members 20 are put on all the surrounding wall members 19, as shown in FIG. 2E. Thereafter, the surrounding wall members 19 and the lid members 20 are subjected to a process for curing the adhesive agent intervened therebetween. For example, when the used adhesive agent is thermally curable, the surrounding wall members 19 and the lid members 20 are heated by exposing them to a hot air blow. Also, when the adhesive agent is photo-curable, the surrounding wall members 19 with the lid members 20 is exposed to ultra-violet irradiation.

In either case, when the adhesive agent intervened between the surrounding wall members 19 and the lid members 20 is cured, the envelopers 18 are defined by the surrounding wall members 19 and the lid members 20 securely attached to each other, and each of the electrical components 14 is accommodated and sealed in a corresponding enveloper 18, resulting in production of the plurality of hollow-package type electronic products 10 on the plate-like substrate 12', as shown in FIG. 2E.

Figure 3:
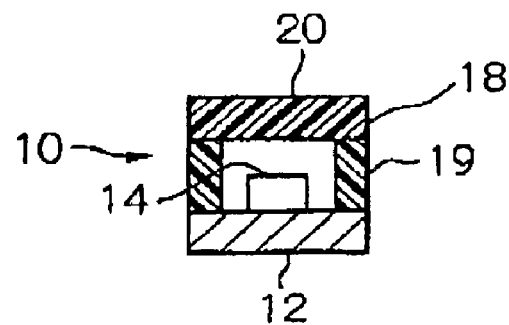
FIG. 3 is a schematic cross-sectional view of a hollow-package type electronic product obtained after the conventional sealing process shown in FIGS. 2A to 2E.

After the sealing process as shown in FIGS. 2A to 2E is completed, the plate-like substrate 12' carrying the hollow-package type electronic products 10 is removed from the sealing machine, and is subjected to a dicing process in which plate-like substrate 12' is cut such that the hollow-package type electronic products 10 are individually separated from each other, as representatively shown in FIG. 3.

As stated above, in the conventional sealing step, the lid members 20 must be individually attached one by one to the surrounding wall members 19, and this impedes efficient mass production of the hollow-package type electronic products 10 at low cost.

Figure 4:
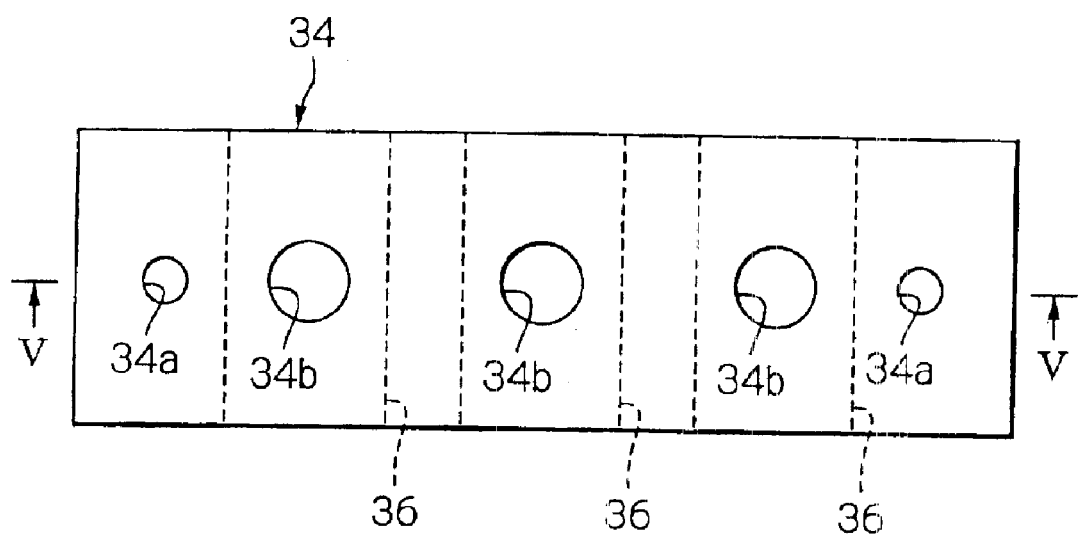
FIG. 4 is a plane view of a first embodiment of a lid-member holder according to the present invention.
Figure 5:
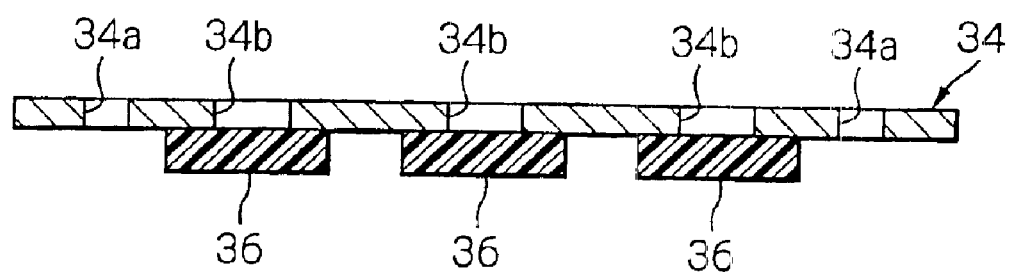
FIG. 5 is a longitudinal cross-sectional view of the lid-member holder, taken along the V—V line of FIG. 4.

With reference to FIGS. 4 and 5, a first embodiment of a lid-member holder according to the present invention is illustrated, and is used in a sealing process according to the present invention as stated in detail hereinafter. In this first embodiment, the lid-member holder comprises a plate-like holder body 34 made of a suitable metal material, such as copper, brass, stainless steel, aluminum or the like. The plate-like holder body 34 is formed with a pair of positioning holes 34a arranged in the vicinity of its ends, and a plurality of circular openings 34b aligned with each other at regular intervals between the positioning holes 34a.

As best shown in FIG. 5, a plurality of lid members 36 are held by the plate-like holder body 34, but it is possible to easily remove these lid members 36 from the plate-like holder body 34 when a predetermined separating force is exerted on the lid members 36, as stated hereinafter. In particular, in this first embodiment, the lid members 36 are molded from a suitable thermosetting resin material, such as epoxy or the like, and a surface of the plate-like holder body 34 is subjected to a rough surface treatment such that the molded lid members 36 are in mechanical engagement with the treated rough surface thereof, whereby the molded lid members 36 are temporarily and mechanically held by the plate-like holder body 34.

As is apparent from FIGS. 4 and 5, the lid members 36 held by the plate-like holder body 34 are correspondingly arranged at regular intervals with respect to the alignment of the circular openings 34b, so that each of the circular openings 34b is closed by a corresponding lid member 36. Each of the circular openings 34b is provided for regulating a holding force with which a corresponding lid member 36 is held by the plate-like holder body 34. In particular, the holding force depends on a contact area between the lid member 36 and the plate-like holder body 34, because the holding force results from the mechanical engagement between the rough surface of the plate-like holder body 34 and the molded lid members 36. Thus, by varying a size of the circular openings 34b, it is possible to regulate the holding force for each of the lid members 36. Further, by varying a roughness of the rough surface of the plate-like holder body 34, it is possible to regulate the holding force for each of the lid members 36.

FIGS. 6A, 6B, 6C and 6D show representative steps of a molding process for producing the plate-like holder body 34 carrying the lid members 36 held thereby.

Figure 6A:
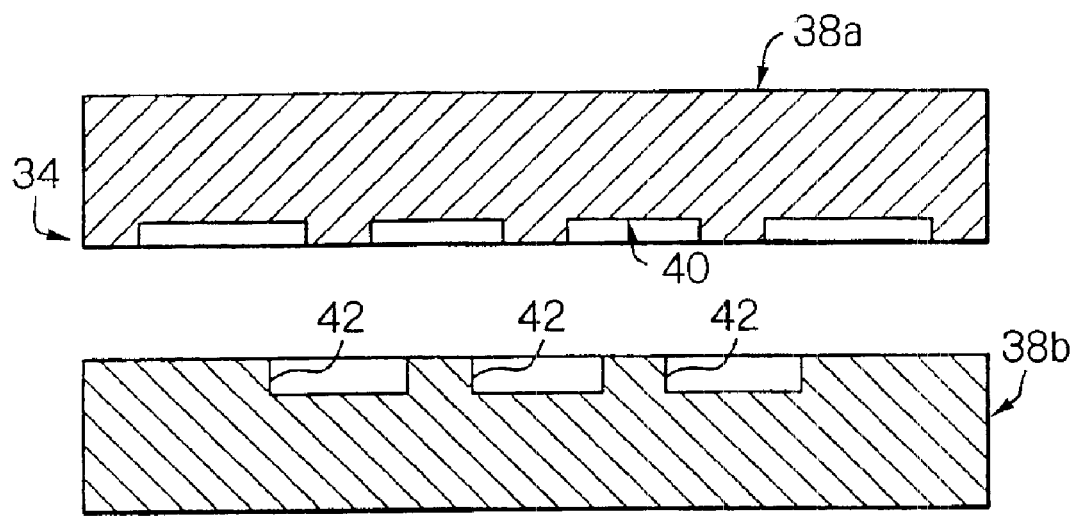
FIG. 6A is a schematic conceptual view showing a representative step of a molding process for producing the lid-member holder carrying a plurality of lid members held thereby.
Figure 6B:
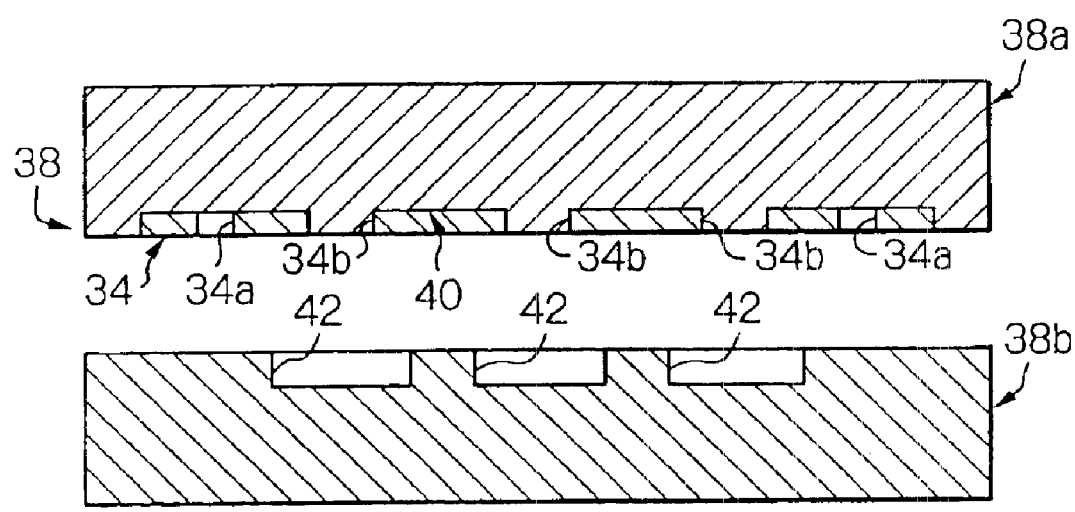
FIG. 6B is a schematic conceptual view showing another representative step of the molding process.

With reference to FIG. 6A, a metal mold 38 used in the aforesaid molding process is illustrated. As shown in this drawing, the metal mold 38 comprises an upper mold die 38a and a lower mold die 38b, which can be mated with each other. The upper mold die 38a is formed with a recess 40 for fittingly receiving the plate-like holder body 34. Namely, the plate-like holder body 34 is received in the recess 40 in a complementary manner. The lower mold die 28a is formed with a plurality of molding cavities 42 for molding the lid members 36.

Figure 6C:
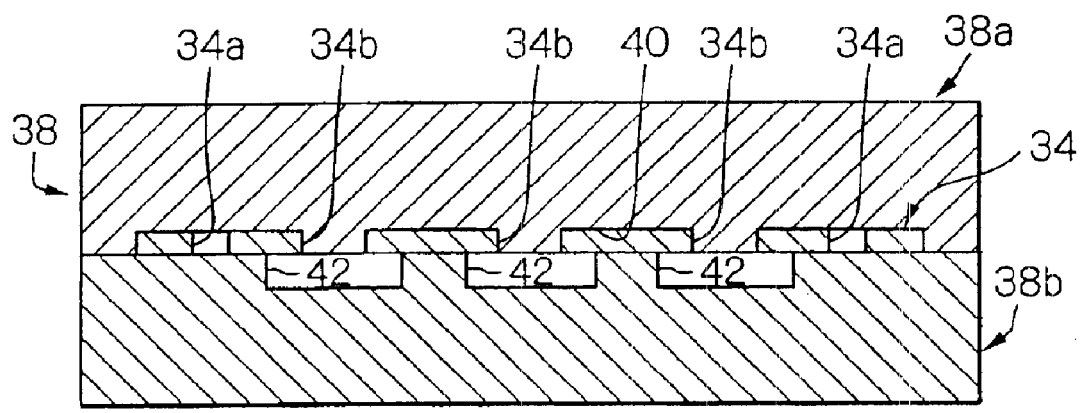
FIG. 6C is a schematic conceptual view showing yet another representative step of the molding process.

As shown in 6B, first, the plate-like holder body 34 is fittingly received in the recess 40 such that the rough surface of the plate-like holder body 34 is exposed to the outside. Then, as shown in FIG. 6C, both the upper and lower mold dies 28a and 28b are mated with each other so that the molding cavities 42 are completely closed. Namely, as is apparent from FIG. 6C, each of the molding cavities is partially defined by the rough surface of the plate-like holder body 34.

Figure 6D:
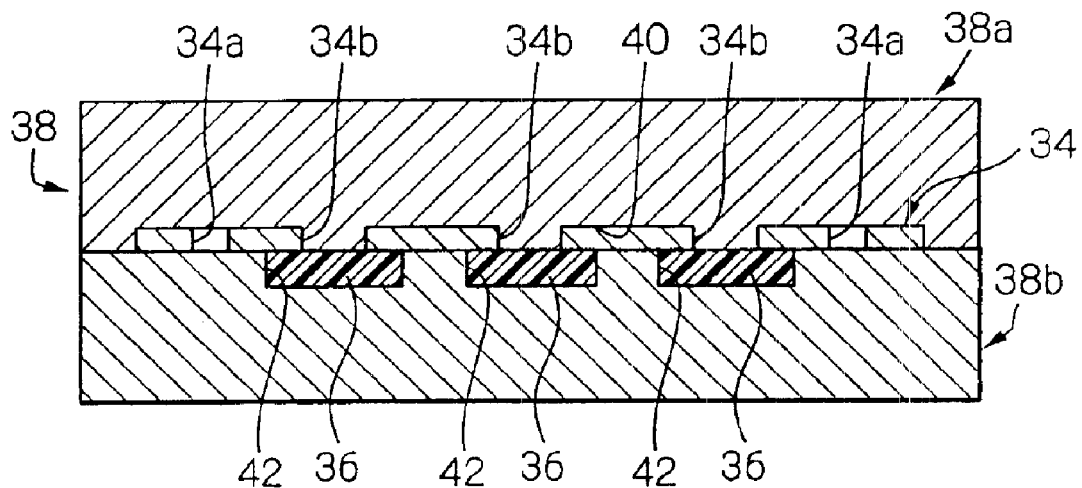
FIG. 6D is a schematic conceptual view showing still yet another representative step of the molding process.

Thereafter, a suitable thermosetting resin material, such as epoxy or the like, is introduced into the molding cavities 42, as shown in FIG. 6D. Then, the metal mold 38 is heated such that the introduced resin materials are thermally cured, resulting in completion of the molding of the lid members 36. Of course, when the introduced resin materials are thermally cured, the mechanical engagements are established between the molded lid members 36 and the rough surface of the plate-like holder body 34, whereby the molded lid members 36 are temporarily and mechanically held by the plate-like holder body 34. Thus, by opening the metal mold 38, it is possible to obtain the plate-like holder body 34 carrying the lid members 36 held thereby.

With reference to FIGS. 7A, 7B, 7C and 7D, the above-mentioned sealing process according to the present invention is conceptually illustrated, and forms a part of a production process for manufacturing a plurality of hollow-package type electronic products in a lump, with each hollow-package type electronic product being substantially identical to the electronic product 10 shown in FIG. 1.

Figure 7A:
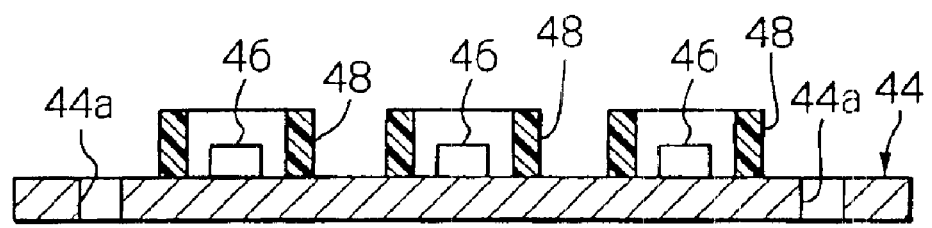
FIG. 7A is a schematic conceptual cross-sectional view showing a representative step of a sealing process according to the present invention, which forms a part of a production process for manufacturing a plurality of hollow-package type electronic products.

In order to manufacture the plurality of hollow-package type electronic products in a lump, a plate-like metal substrate is prepared, as shown in FIG. 7A. The plate-like substrate 44 is made of a suitable metal material, such as copper, brass, stainless steel, aluminum or the like, and is formed with a pair of positioning holes 44a arranged in the vicinity of its ends. The positioning holes 44a are the same size as the positioning holes 34a formed in the plate-like holder body 34, and are arranged in the same manner the positioning holes 34a. Note, similar to the aforesaid conventional case shown in FIGS. 2A to 2E, when the hollow-package type electronic products (10) are produced according to the production process concerned, the individual heat-radiating plates (12) are derived from the plate-like substrate 44.

As shown in FIG. 7A, a plurality of electronic components 46 are securely mounted on and adhered to the plate-like substrate 44 with a suitable adhesive agent, so as to be arranged and aligned with each other at the same regular intervals as the lid members 36 held by the plate-like holder body 34. Then, a plurality of surrounding wall members 48, which may be made of a suitable resin material such as epoxy, are securely mounted on and adhered to the plate-like substrate 44 with a suitable adhesive agent, such that the respective electronic components 46 are encompassed by the surrounding wall members 48. Thus, the surrounding wall members 48 are also arranged and aligned with each other at the same regular intervals as the lid members 36. Thereafter, a suitable adhesive agent is applied to the top end faces of the surrounding wall members 48.

Note, in FIG. 7A, although not shown to avoid complexity of illustration, each of the surrounding wall members 48 is provided with the leads (23 and 24), and the respective inner lead sections (23a and 24a) of the leads are electrically connected to the electrode pads (16 and 17) of a corresponding electronic component 46 with the bonding-wires (26 and 28), as shown in FIG. 1.

Figure 7B:
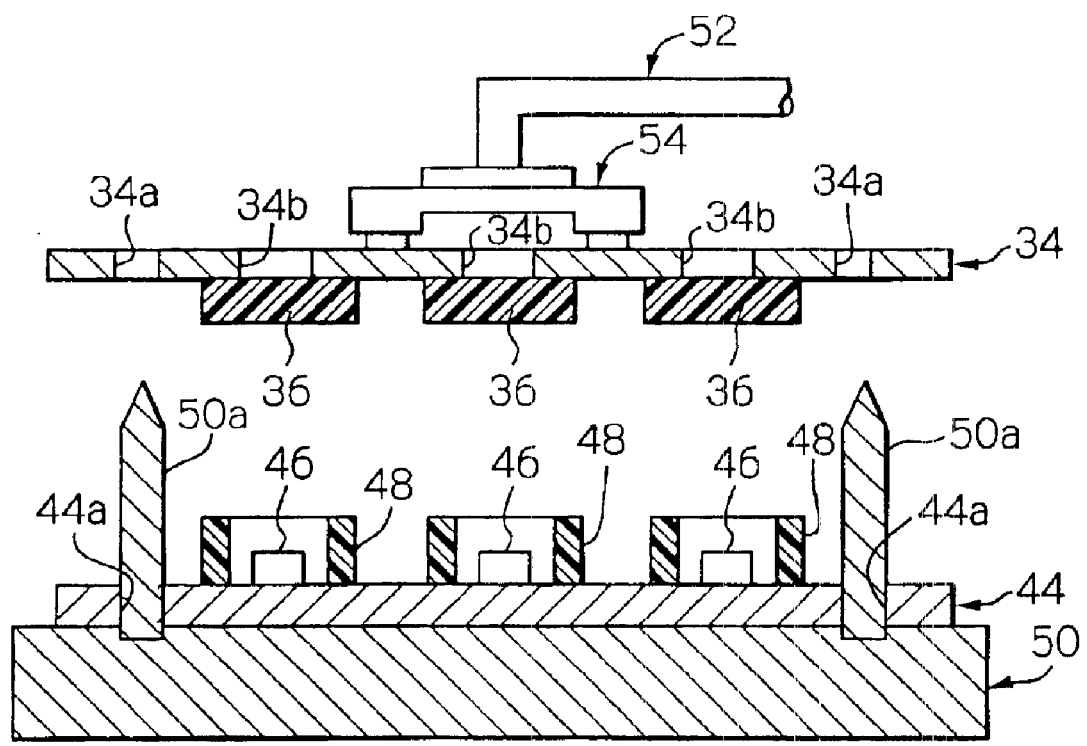
FIG. 7B is a schematic conceptual cross-sectional view showing another representative step of the sealing process according to the present invention.

After the application of the adhesive agent to the top end faces of the surrounding wall members 48, the plate-like substrate 44 carrying the electronic components 46 and the surrounding wall members 48 are placed and positioned at a given location on a work-table 50 of an automatic sealing machine, as shown in FIG. 7B. Namely, as shown in FIG. 7B, the work-table 50 is provided with a pair of positioning pins 50a securely planted thereon, and the positioning of the plate-like substrate 44 is carried out by inserting the respective positioning pins 50a into the positioning holes 44a of the plate-like substrate 44.

Figure 7C:
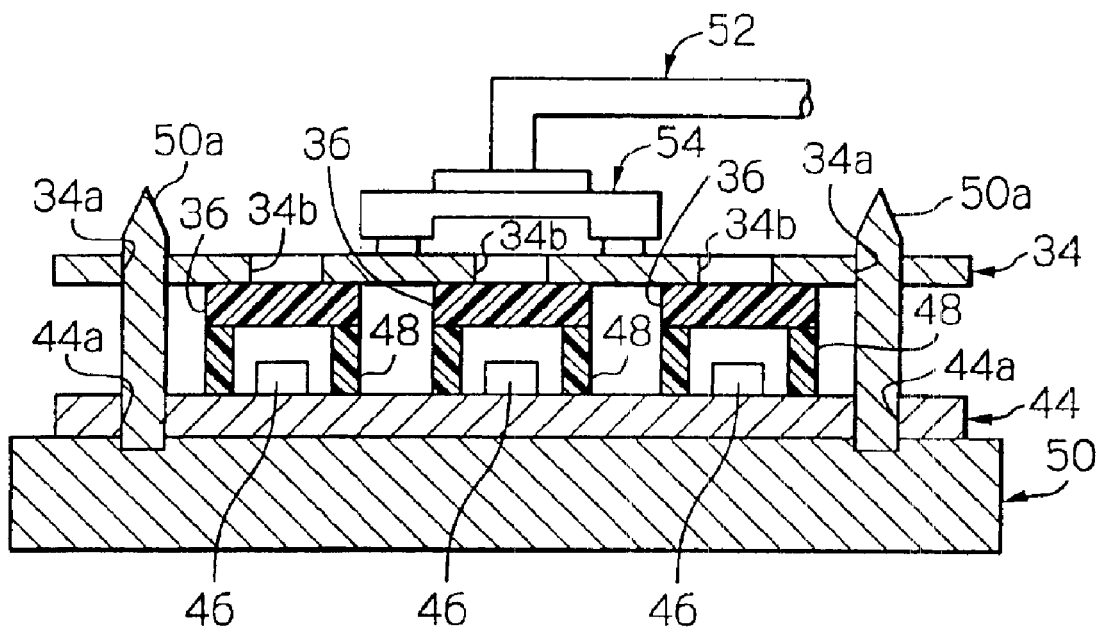
FIG. 7C is a schematic conceptual cross-sectional view showing yet another representative step of the sealing process according to the present invention.

As shown in FIG. 7B, the automatic sealing machine is provided with a movable arm 52 having a pneumatic sucker 54, and the plate-like holder body 34 carrying the lid members 36 is sucked and held by the pneumatic sucker 54. The movable arm 52 is operated by a controller of the automatic sealing machine such that the plate-like holder body 34 sucked by the pneumatic sucker 54 is carried to a position above the plate-like substrate 44 carrying the electronic components 46 and the surrounding wall members 48, and is precisely positioned so as to be arranged and aligned with the plate-like substrate 44. Then, the movable arm 32 is moved down such that the respective positioning pins 50a are inserted into the positioning holes 34a of the plate-like holder body 34, and such that the respective lid members 36 are laid on and registered with the top end faces of the surrounding wall member 48, which is coated with the adhesive agent, as shown in FIG. 7C.

Subsequently, the lid members 36 and the surrounding wall members 48 are subjected to a process for curing the adhesive agent intervened therebetween. For example, when the used adhesive agent is thermally curable, the lid members 36 and the surrounding wall members 48 are heated by exposing them to a hot air blow. Also, when the adhesive agent is photo-curable, the lid members 36 and the surrounding wall members 48 are exposed to ultra-violet irradiation. The adhesive agent is selected such that it is possible to obtain an adhesive force larger than the holding force with which the lid members 36 are held by the plate-like holder body 34, when the adhesive agent is completely cured.

Figure 7D:
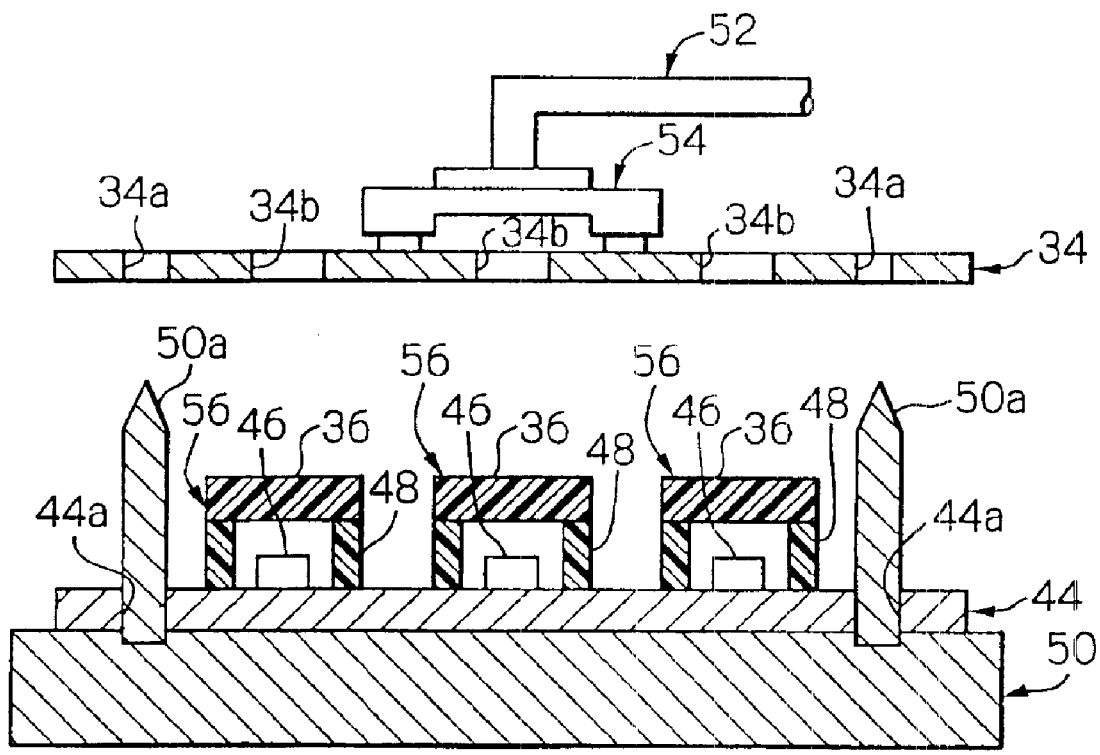
FIG. 7D is a schematic conceptual cross-sectional view showing still yet another representative step of the sealing process according to the present invention.

After the adhesive agent intervened between the lid members 36 and the surrounding wall members 48 is completely cured, the movable arm 32 is moved up, with the plate-like holder body 34 being sucked and held by the pneumatic sucker 54, whereby the plate-like holder body 34 can be separated from the lid members 36 securely adhered to the top end faces of the surrounding wall members 48, as shown in FIG. 7D, because the adhesive force between the lid members 36 and the surrounding wall members 48 is larger than the holding force between the plate-like holder body 34 and the lid members 36, as stated above. Note, of course, the sucking force, with which the plate-like holder body 34 is sucked and held by the pneumatic sucker 54, is sufficiently larger than the holding force between the plate-like holder body 34 and the lid members 36.

Thus, a plurality of envelopers, generally indicated by reference 56 in FIG. 7D, can be defined in a lump by the lid members 36 and the surrounding wall members 48 securely attached to each other, and each of the electrical components 46 is accommodated and sealed in a corresponding enveloper 56, resulting in production of the plurality of hollow-package type electronic products on the plate-like substrate 44. After the sealing process as shown in FIGS. 7A to 7D is completed, the plate-like substrate 44 carrying the hollow-package type electronic products is removed from the sealing machine, and is subjected to a dicing process in which plate-like substrate 44 is cut such that the hollow-package type electronic products are individually separated from each other.

As is apparent from the foregoing, according to the present invention, it is possible to efficiently carry out the sealing process at low cost in that the respective surrounding wall members 48 can be simultaneously sealed in a lump with the lid members 36, using the plate-like holder body 34 carrying the plurality of lid members 36.

In the above-mentioned first embodiment, although the openings 34*b* for regulating the holding force for the lid members 36 are circular, these openings 34*b* may have another shape, such as a rectangle, a triangle, an oval or the like.

Figure 8:
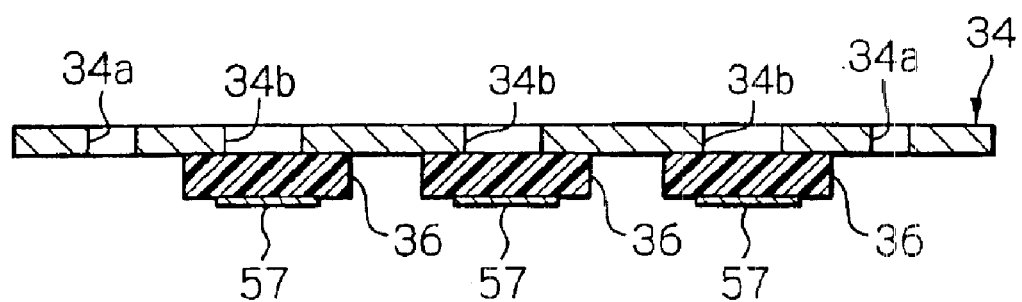
FIG. 8 is a longitudinal cross-sectional view, similar to FIG. 5, showing a modification of the first embodiment of the lid-member holder according to the present invention.

With reference to FIG. 8, a modification of the aforesaid first embodiment is illustrated. Note, this drawing corresponds to FIG. 5, and the features similar to those shown in FIG. 5 are indicated by the same references in FIG. 8.

In this modified embodiment, each of the lid members 36 is provided with an additional function by forming an electrically-conductive layer 57 on a bottom surface thereof. Similar to the first embodiment, the respective surrounding wall members 48 can be efficiently sealed with the lid members 36 in a lump, using the plate-like holder body 34 carrying the plurality of lid members 36 with the electrically-conductive layers 57.

Figure 9:
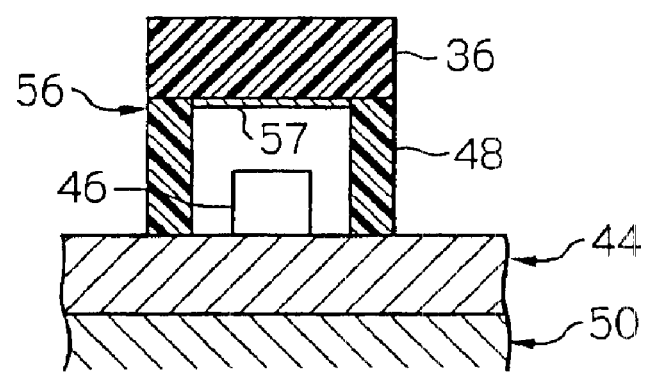
FIG. 9 is a schematic conceptual cross-sectional view, corresponding to a partially-enlarged view of FIG. 7D, in which a surrounding wall member is sealed with a lid member having an electrically-conductive layer.

Thus, when the envelopers 56 are completely defined, each of the electrically-conductive layer 57 serves as an electromagnetic shield in a corresponding enveloper 56, as shown in FIG. 9 corresponding to a partially-enlarged view of FIG. 7D. Namely, it is possible to effectively suppress an emission of high frequency noises from each electronic component 46.

In the modified embodiment, the formation of the electrically-conductive layers 57 involves an additional process, such as a sputtering process, a plating process or the like. Nevertheless, it is possible to efficiently carry out the additional process at low cost, because the plurality of lid members 36 held by the plate-like holder body 34 can be processed in a lump in the additional process.

Figure 10:
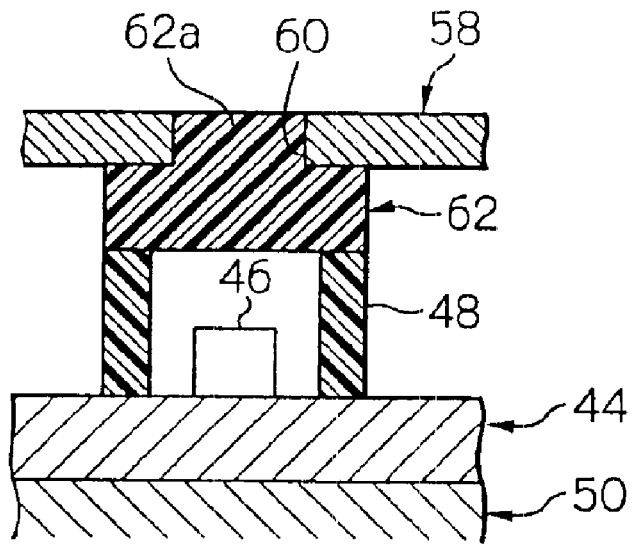
FIG. 10 is a schematic conceptual cross-sectional view, corresponding to a partially-enlarged view of FIG. 7C, showing a second embodiment of the lid-member holder according to the present invention.

With reference to FIG. 10, a second embodiment of the lid-member holder according to the present invention is partially illustrated. Note, this drawing corresponds to a partially-enlarged view of FIG. 7C, and the features similar to those shown in FIG. 7C are indicated by the same references in FIG. 10.

In this second embodiment, the lid-member holder also comprises a plate-like holder body 58 made of a suitable metal material, such as copper, brass, stainless steel, aluminum or the like. In FIG. 10, although not illustrated, the plate-like holder body 58 is formed with a pair of positioning holes arranged in the vicinity of its ends, and is positioned with respect to the plate-like substrate 44 by inserting the positioning pins 50*a* of the sealing machine into the positioning holes of the plate-like holder body 58 when the sealing process is performed in the sealing machine as shown in FIGS. 7A to 7D.

The plate-like holder body 58 is formed with a plurality of circular openings 60 which are arranged and aligned with each other at the same regular intervals as the surrounding wall members 48 securely mounted on the plate-like substrate 44. As is apparent from FIG. 10, the circular openings 60 are used to temporarily and mechanically hold a plurality of lid members 62 by the plate-like holder body 58.

In particular, similar to the first embodiment, the lid members 62 are made of a suitable thermosetting resin material, such as epoxy or the like, using a metal mold in which the plate-like holder body 58 is incorporated, but the metal mold is constituted such that each of the molded lid members 62 has a stub portion 62*a* integrally protruded from a top surface thereof. Namely, during the molding process, the circular openings 60 are filled with the resin material. Thus, when the molding of the lid members 62 is completed, each of the stub portions 62*a*, which are integrally protruded from the top surfaces of the lid members 62, is closely fitted into a corresponding circular opening 60, whereby the lid members 62 are temporarily and mechanically held by the plate-like holder body 58.

In the second embodiment, at least one groove may be formed in an inner peripheral wall face of each circular opening 60 so as to be extended in a direction parallel to a central axis thereof, to thereby increase a contact area between the circular opening 60 and the stub portion 62*a*. Namely, by varying the contact area between the circular opening 60 and the stub portion 62*a*, it is possible to regulate a holding force with which the lid members 62 are held by the plate-like holder body 58. Also, as a substitute for the circular openings 60, a plurality of openings having another shape, such as a rectangle, a triangle, an oval or the like, may be formed in the plate-like holder body 58.

Figure 11:
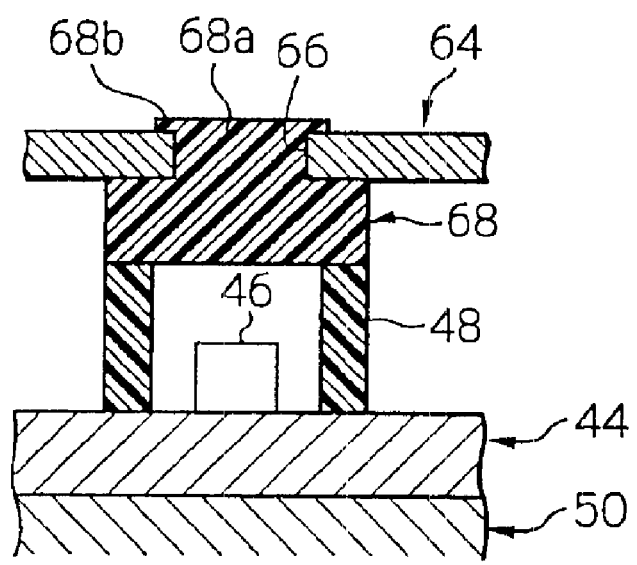
FIG. 11 is a schematic conceptual cross-sectional view, corresponding to a partially-enlarged view of FIG. 7C, showing a third embodiment of the lid-member holder according to the present invention.

With reference to FIG. 11, a third embodiment of the lid-member holder according to the present invention is partially shown. Note, this drawing also corresponds to a partially-enlarged view of FIG. 7C, and the features similar to those shown in FIG. 7C are indicated by the same references in FIG. 11.

In this third embodiment, the lid-member holder also comprises a plate-like holder body 64 made of a suitable metal material, such as copper, brass, stainless steel, aluminum or the like. In FIG. 11, although not illustrated, the plate-like holder body 64 is formed with a pair of positioning holes arranged in the vicinity of its ends, and is positioned with respect to the plate-like substrate 44 by inserting the positioning pins 50*a* of the sealing machine into the positioning holes of the plate-like holder body 64 when the sealing process is performed in the sealing machine, as shown in FIGS. 7A to 7D.

The plate-like holder body 64 is formed with a plurality of circular openings 66 which are arranged and aligned with each other at the same regular intervals as the surrounding wall members 48 securely mounted on the plate-like substrate 44. As is apparent from FIG. 11, the circular openings 66 are used to temporarily and mechanically hold a plurality of lid members 68 by the plate-like holder body 64.

In particular, similar to the first embodiment, the lid members 68 are made of a suitable thermosetting resin material, such as epoxy or the like, using a metal mold in which the plate-like holder body 64 is incorporated, but the metal mold is constituted such that each of the molded lid members 68 includes a stub portion 68*a*, and a thin flange element 68*b* integrally and radially extended from a top surface of the stub portion 68*a*. Namely, the metal mold defines an additional molding cavity for forming the thin flange element 68*b*, and the circular openings 60 and the additional molding cavities are filled with the resin material during the molding process. Thus, when the molding of the lid members 68 is completed, the respective stub portions 68a with the thin flange elements 68b are fitted into the circular openings 66 such that each of the thin flanges 68b is in close contact with a surface of the plate-like holder body which surrounds a corresponding circular opening 66, whereby the lid members 68 are temporarily and mechanically held by the plate-like holder body 64.

In the third embodiment, a thickness of the thin flange elements 68b is selected such that the thin flange elements 68b are easily broken when the plate-like holder body 68 is lifted up by the pneumatic sucker 54 after the adhesive agent intervened between the lid members 68 and the surrounding wall members 48 is completely cured. Namely, a force necessary to break the thin flange elements 68b is smaller than the adhesive force between the lid members 68 and the surrounding wall members 48, and thus it is possible to separate the plate-like holder body 64 from the lid members 68 securely adhered to the top end faces of the surrounding wall members 48.

In the third embodiment, although the openings 66 are circular, these openings may have another shape, such as a rectangle, a triangle, an oval or the like.

Figure 12:
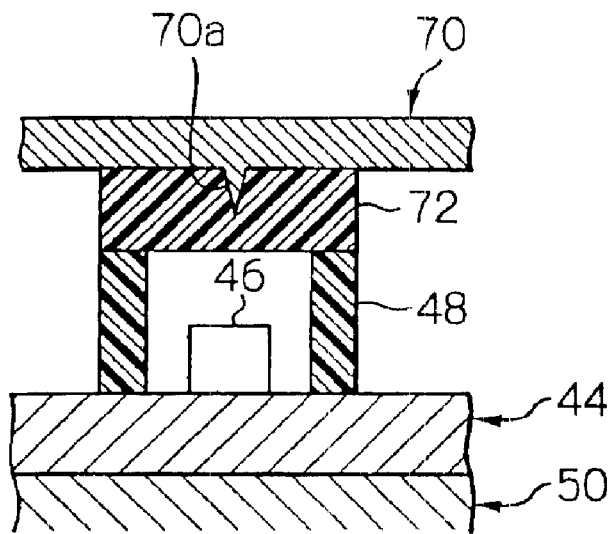
FIG. 12 is a schematic conceptual cross-sectional view, corresponding to a partially-enlarged view of FIG. 7C, showing a fourth embodiment of the lid-member holder according to the present invention.

With reference to FIG. 12, a fourth embodiment of the lid-member holder according to the present invention is partially shown. Note, this drawing also corresponds to a partially-enlarged view of FIG. 7C, and the features similar to those shown in FIG. 7C are indicated by the same references in FIG. 12.

In this fourth embodiment, the lid-member holder comprises a plate-like holder body 70 made of a suitable metal material, such as copper, brass, stainless steel, aluminum or the like. In FIG. 12, although not illustrated, the plate-like holder body 70 is formed with a pair of positioning holes arranged in the vicinity of its ends, and is positioned with respect to the plate-like substrate 44 by inserting the positioning pins 50a of the sealing machine into the positioning holes of the plate-like holder body 70 when the sealing process is performed in the sealing machine, as shown in FIGS. 7A to 7D.

The plate-like holder body 70 is provided with a plurality of spike elements 70a integrally formed therewith, and these spike elements 70a are arranged and aligned with each other at the same regular intervals as the surrounding wall members 48 securely mounted on the plate-like substrate 44. As is apparent from FIG. 12, the spike elements 70a are used to temporarily and mechanically hold a plurality of lid members 72 by the plate-like holder body 70.

In particular, similar to the first embodiment, the lid members 72 are made of a suitable thermosetting resin material, such as epoxy or the like, using a metal mold in which the plate-like holder body 70 is incorporated, but the metal mold is constituted such that each of the molded lid members 72 is penetrated by a corresponding spike element 70a. Thus, when the molding of the lid members 72 is completed, each of the molded lid members 72 is temporarily and mechanically held by the plate-like holder body 70, due to the penetration of the spike elements 70a into the molded lid members 72.

In the fourth embodiment, by varying a configuration of the spike elements 70a, it is possible to regulate the holding force with which the lid members 72 is held by the penetration of the spike elements 70a into the molded lid members 72. Of course, the configuration of the spike elements 70a is selected such that the holding force for the lid members 72 is smaller than the adhesive force between the lid members 72 and the surrounding wall members 48. Thus, when the plate-like holder body 70 is lifted up by the pneumatic sucker 54 after the adhesive agent intervened between the lid members 72 and the surrounding wall members 48 is completely cured, the plate-like holder body 70 can be separated from the lid members 72 securely adhered to the top end faces of the surrounding wall members 48.

In the aforesaid first, second, third and fourth embodiments, it is significant to substantially eliminate a thermal expansion difference between the plate-like holder body (34, 58, 64, 70) and the plate-like substrate 44, because it is possible to more precisely position the respective lid members (36, 62, 68, 72) with respect to the surrounding wall members 48. Thus, it is preferable to make the plate-like holder body (34, 58, 64, 70) of the same metal material as the plate-like substrate 44. Nevertheless, if necessary, the metal material of the plate-like holder body (34, 58, 64, 70) may be different from that of the plate-like substrate 44. Further, it is possible to make the plate-like holder body (34, 58, 64, 70) of another suitable material except for the metal material, for example, a ceramic material, if necessary.

Figure 13:
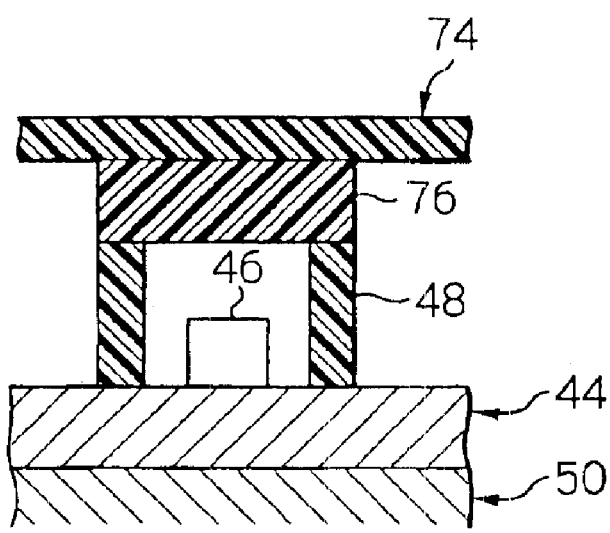
FIG. 13 is a schematic conceptual cross-sectional view, corresponding to a partially-enlarged view of FIG. 7C, showing a fifth embodiment of the lid-member holder according to the present invention.

With reference to FIG. 13, a fifth embodiment of the lid-member holder according to the present invention is partially shown. Note, this drawing also corresponds to a partially-enlarged view of FIG. 7C, and the features similar to those shown in FIG. 7C are indicated by the same references in FIG. 13.

In this fifth embodiment, the lid-member holder comprises a plate-like holder body 74 made of a suitable resin material such as polyimide. In FIG. 13, although not illustrated, the plate-like holder body 74 is formed with a pair of positioning holes arranged in the vicinity of its ends, and is positioned with respect to the plate-like substrate 44 by inserting the positioning pins 50a of the sealing machine into the positioning holes of the plate-like holder body 74 when the sealing process is performed in the sealing machine, as shown in FIGS. 7A to 7D.

The plate-like holder body 74 holds a plurality of lid members 76 temporarily adhered thereto, and these lid members 76 are arranged and aligned with each other at the same regular intervals as the surrounding wall members 48 securely mounted on the plate-like substrate 44. Similar to the first embodiment, the lid members 76 are made of a suitable thermosetting resin material, such as epoxy or the like, using a metal mold in which the plate-like holder body 74 is incorporated, and the lid members 76 are temporarily adhered to the plate-like holder body 74 while molding the lid members 76.

In particular, in this fifth embodiment, as stated above, the respective plate-like holder body 74 and lid members 76 are made of the two different resin materials (i.e., polyimide and epoxy). Accordingly, during the molding process for the lid members 76, the two different resin materials cannot be fused and merged with each other at the interface therebetween, but a suitable adhesive force acts on the interface between the plate-like holder body 74 and the molded lid members 76. Thus, it is possible to temporarily hold the molded lid members 76 by the plate-like holder body 74 due to the aforesaid adhesive force acting on the interface therebetween.

Of course, the adhesive force acting on the interface between the plate-like holder body 74 and the molded lid members 76 is sufficiently smaller than the active adhesive force between the lid members 76 and the surrounding wall members 48. Thus, when the plate-like holder body 74 is lifted up by the pneumatic sucker 54 after the adhesive agent intervened between the lid members 76 and the surrounding wall members 48 is completely cured, it is possible to easily separate the plate-like holder body 74 from the lid members 76 securely adhered to the top end faces of the surrounding wall members 48.

In this fifth embodiment, a surface of the plate-like holder body 74 may be subjected to a rough surface treatment such that the molded lid members 36 can be in mechanical engagement with the treated rough surface thereof. Namely, in this case, in addition to the adhesive force acting on the interface between the plate-like holder body 74 and the molded lid members 76, the mechanical engagement between the treated rough surface of the plate-like holder body 74 and the molded lid members 76 further contributes to the temporary holding of the lid members 76 by the plate-like holder body 74. Also, when the plate-like holder body 74 has the treated rough surface, by varying a roughness of the rough surface of the plate-like holder body 74, it is possible to regulate a holding force with which the lid members 76 is held by the plate-like holder body 74.

In the above-mentioned embodiments, although the lid members (36, 62, 68, 72, 76) are made of the thermosetting resin material such as epoxy, another thermosetting resin material may be used for the lid members (36, 62, 68, 72, 76). Also, if necessary, the lid members (36, 62, 68, 72, 76) may be made of a thermoplastic resin material. Further, it is possible to make the lid members (36, 62, 68, 72, 76) of a resin-based composite material containing a filler component, such as ceramic powder, carbon powder, metal powder, short glass fibers or the like.

Similar to the above-mentioned modification of the first embodiment (FIGS. 8 and 9), in the second, third, fourth and fifth embodiments, the plurality of lid members (62, 68, 72, 76) held by the plate-like holder body (58, 64, 70, 74) may be additionally processed in a lump, to thereby provide each lid member (62, 68, 72, 76) with an additional function. For example, in order to form respective electrically-conductive layers (57) on the lid members (62, 68, 72, 76), the plurality of lid members (62, 68, 72, 76) held by the plate-like holder body (58, 64, 70, 74) can be efficiently processed in a lump with a sputtering process, a plating process or the like.

Figure 14:
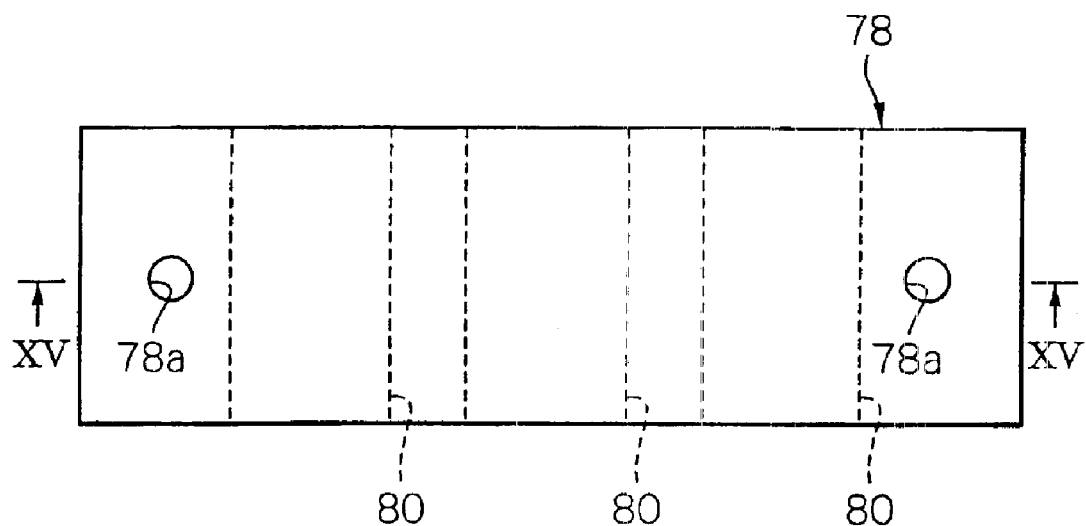
FIG. 14 is a plane view of a sixth embodiment of the lid-member holder according to the present invention.
Figure 15:
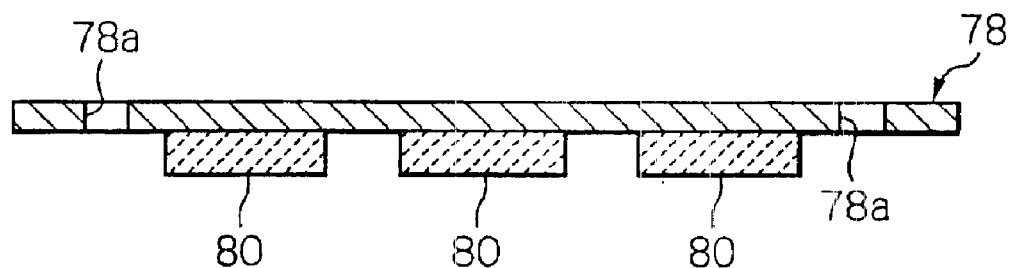
FIG. 15 is a longitudinal cross-sectional view of the lid-member holder, taken along the XV—XV line of FIG. 14.

With reference to FIGS. 14 and 15, a sixth embodiment of the lid-member holder according to the present invention is illustrated. In this sixth embodiment, similar to the first embodiment, the lid-member holder comprises a plate-like holder body 78 made of a suitable metal material, such as copper, brass, stainless steel, aluminum or the like. The plate-like holder body 78 is formed with a pair of positioning holes 78a arranged in the vicinity of its ends, and is positioned with respect to the plate-like substrate 44 by inserting the positioning pins 50a of the sealing machine into the positioning holes 78a of the plate-like holder body 78 when the sealing process is performed in the sealing machine, as shown in FIGS. 7A to 7D.

The plate-like holder body 78 holds a plurality of lid members 80 which are arranged and aligned with each other at the same regular intervals as the surrounding wall members 48 securely mounted on the plate-like substrate 44. In the sixth embodiment, the lid members 76 are made of a suitable ceramic material, and are temporarily adhered to the plate-like holder body 78 with a suitable adhesive agent. An adhesive force obtained by this adhesive agent is smaller than that of the adhesive agent which is used to adhere the lid members 80 to the surrounding wall members 48. Thus, when the plate-like holder body 78 is lifted up by the pneumatic sucker 54 after the adhesive agent intervened between the lid members 80 and the surrounding wall members 48 is completely cured, the plate-like holder body 78 can be separated from the lid members 80 securely adhered to the top end faces of the surrounding wall members 48.

In the sixth embodiment, although the plate-like holder body 78 is made of the metal material, it is possible to use a suitable resin material, such as polyimide or the like for the plate-like holder body 78. On the other hand, although the lid members 80 are made of the ceramic material, it is possible to use a suitable metal material, such as, copper, brass, stainless steel, aluminum, molybdenum, tungsten or the like.

Also, similar to the above-mentioned embodiments, in the sixth embodiment, the plurality of lid members 80 held by the plate-like holder body 78 can be additionally processed in a lump, to thereby provide each lid member 80 with an additional function.

Figure 16:
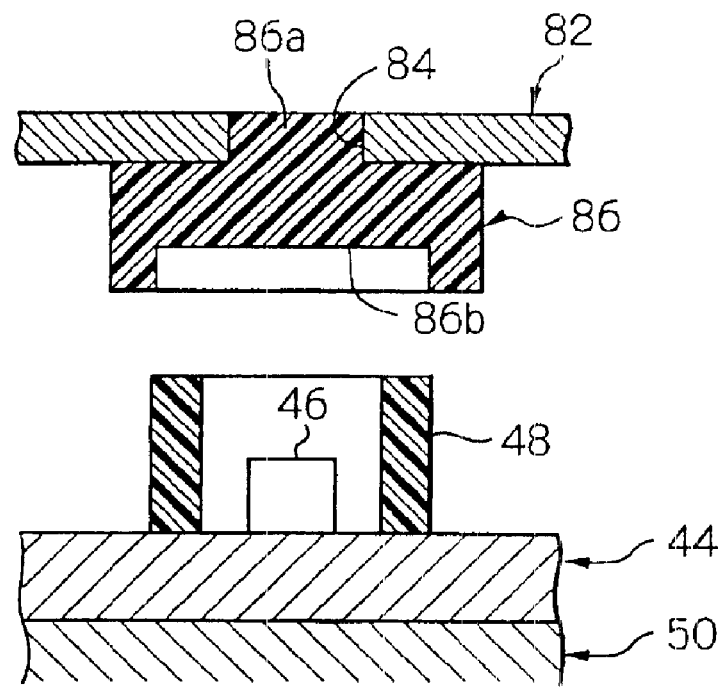
FIG. 16 is a schematic conceptual cross-sectional view, corresponding to a partially-enlarged view of FIG. 7B, showing a seventh embodiment of the lid-member holder according to the present invention.
Figure 17:
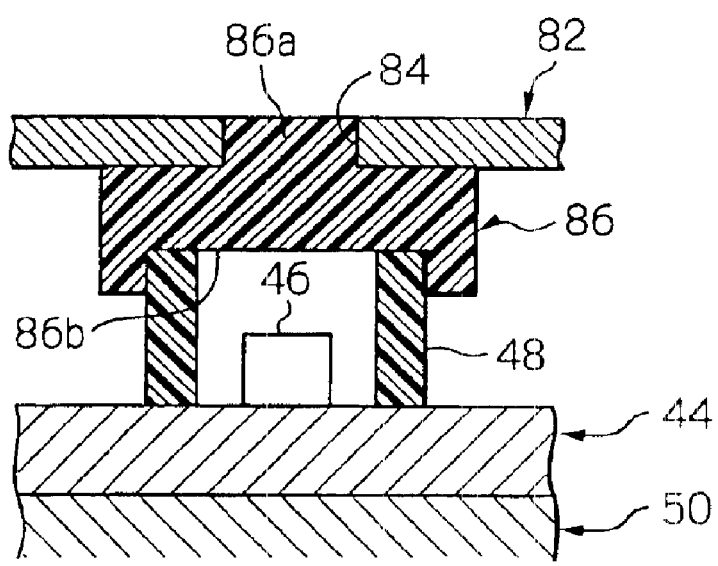
FIG. 17 is a schematic conceptual cross-sectional view, corresponding to a partially-enlarged view of FIG. 7C, showing the seventh embodiment of the lid-member according to the present invention.

With reference to FIGS. 16 and 17, a seventh embodiment of the lid-member holder according to the present invention is shown. Note, FIGS. 16 and 17 correspond to partially-enlarged views of FIGS. 7B and 7C, respectively, and the features similar to those shown in FIGS. 7B and 7C are indicated by the same references in FIGS. 16 and 17.

In this seventh embodiment, the lid-member holder comprises a plate-like holder body 82 made of a suitable metal material, such as copper, brass, stainless steel, aluminum or the like. In FIGS. 16 and 17, although not illustrated, the plate-like holder body 82 is formed with a pair of positioning holes arranged in the vicinity of its ends, and is positioned with respect to the plate-like substrate 44 by inserting the positioning pins 50a of the sealing machine into the positioning holes of the plate-like holder body 82 when the sealing process is performed in the sealing machine, as shown in FIGS. 7A to 7D.

The plate-like holder body 82 is formed with a plurality of circular openings 84 which are arranged and aligned with each other at the same regular intervals as the surrounding wall members 48 securely mounted on the plate-like substrate 44. As is apparent from FIGS. 16 and 17, the circular openings 84 are used to temporarily and mechanically hold a plurality of lid members 86 by the plate-like holder body 82.

In particular, similar to the first embodiment, the lid members 86 are made of a suitable thermosetting resin material, such as epoxy or the like, using a metal mold in which the plate-like holder body 82 is incorporated, but the metal mold is constituted such that each of the molded lid members 86 has a stub portion 86a integrally protruded from a top surface, and a rectangular recess 86b formed in a bottom surface thereof. Namely, during the molding process, the circular openings 84 are filled with the resin material. Thus, when the molding of the lid members 86 is completed, each of the stub portions 86a, which are integrally protruded from the top surfaces of the lid members 86, is closely fitted into a corresponding circular opening 84, whereby the lid members 86 are temporarily and mechanically held by the plate-like holder body 82. Namely, the temporary holding of the lid members 86 by the plate-like holder body 82 is achieved in substantially the same manner as in the aforesaid second embodiment.

In the seventh embodiment, each of the lid members 86 is not adhered to a corresponding surrounding wall member 48, but the top end of the surrounding wall member 48 is securely fitted in the rectangular recess 86b of the lid member 86, as shown in FIG. 17. In particular, the size of the rectangular recess 86b is somewhat smaller than the size of the top end of the surrounding wall member 86 at a usual ambient temperature, but the resin material of the lid members 86 has a coefficient of thermal expansion larger that of the surrounding wall member 48. Thus, during the sealing process, the lid members 86 and the surrounding wall members 48 are heated by exposing them to a hot air blow, so that the top end of each surrounding wall member 48 can be easily and loosely received in a corresponding rectangular recess 86b of each lid member 86.

After the receipt of the top ends of the surrounding wall members 48 in the rectangular recesses 86b of the lid members 86, the hot air blow is stopped, and the lid members 86 and the surrounding wall members 48 are cooled to the usual ambient temperature, whereby they are securely coupled to each other in the interference fit manner. Thus, when the plate-like holder body 82 is lifted up by the pneumatic sucker 54, the plate-like holder body 82 can be separated from the lid members 86 securely coupled to the top end of the surrounding wall members 48.

Similar to the aforesaid second embodiment, in the seventh embodiment, at least one groove may be formed in an inner peripheral wall face of each circular opening 84 so as to be extended in a direction parallel to a central axis thereof, to thereby increase a contact area between the circular openings 84 and the stub portion 86a. Namely, by varying the contact area between contact area between the circular openings 84 and the stub portion 86a, it is possible to regulate a holding force with which the lid members 86 are held by the plate-like holder body 82. Also, although the openings 84 are circular, these openings may have another shape, such as a rectangle, a triangle, an oval or the like.

In this seventh embodiment, although the surrounding wall members 48 and the lid members 86 are made of epoxy, it is possible to make the coefficient of thermal expansion of the lid members 86 larger than that of the surrounding wall members 48. In particular, in general, an coefficient of thermal expansion of a resin material such as epoxy can be optionally controlled and regulated in a given range by selecting one or more kinds of filler to be contained in the resin material and adjusting an amount of filler to be contained in the resin material. Thus, it is possible to easily and properly set and determine the thermal expansion coefficients of the surrounding wall members 48 and the lid members 86, such that they can be securely coupled to each other in the interference fit manner.

Also, in the seventh embodiment, the lid members 86 may be made of a suitable metal material, such as copper, aluminum or the like, which exhibits a relatively large coefficient of thermal expansion.

Figure 18:
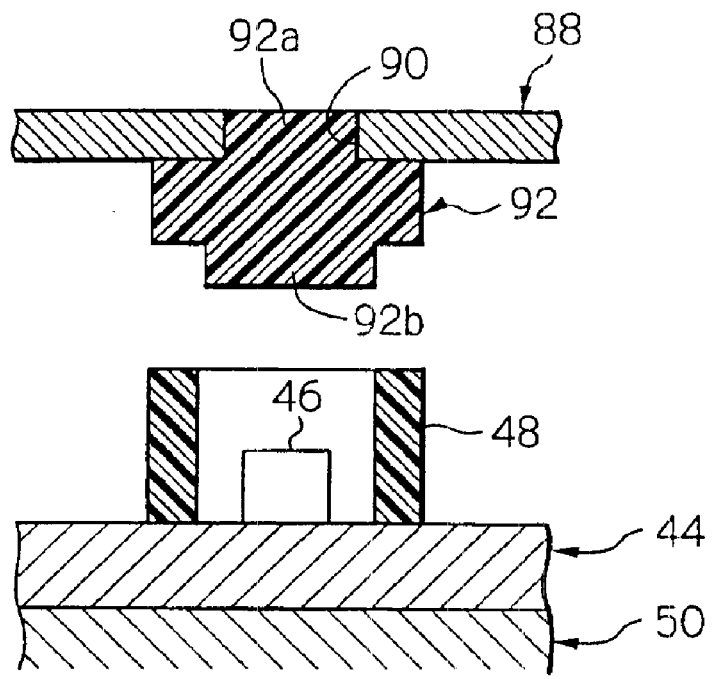
FIG. 18 is a schematic conceptual cross-sectional view, corresponding to a partially-enlarged view of FIG. 7B, showing an eighth embodiment of the lid-member holder according to the present invention.
Figure 19:
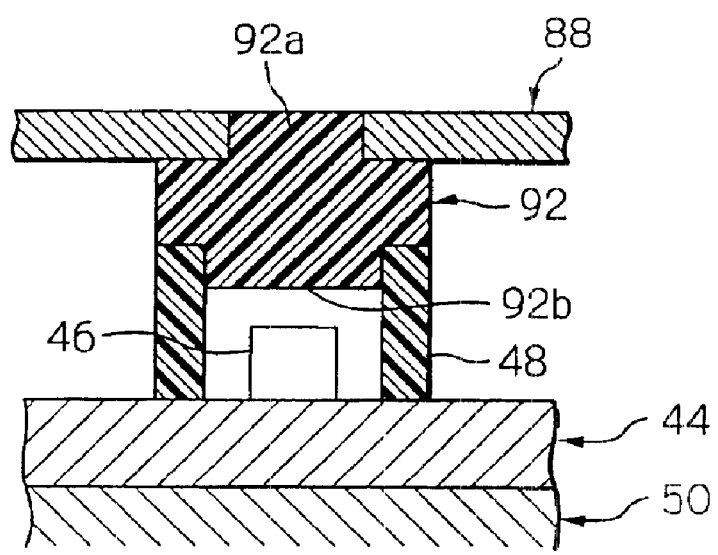
FIG. 19 is a schematic conceptual cross-sectional view, corresponding to a partially-enlarged view of FIG. 7C, showing the eighth embodiment of the lid-member holder according to the present invention.

With reference to FIGS. 18 and 19, an eighth embodiment of the lid-member holder according to the present invention is shown. Note, similar to the seventh embodiment, FIGS. 18 and 19 correspond to partially-enlarged views of FIGS. 7B and 7C, respectively, and the features similar to those shown in FIGS. 7B and 7C are indicated by the same references in FIGS. 18 and 19.

In this eighth embodiment, the lid-member holder comprises a plate-like holder body 88 made of a suitable metal material, such as copper, brass, stainless steel, aluminum or the like. In FIGS. 18 and 19, although not illustrated, the plate-like holder body 88 is formed with a pair of positioning holes arranged in the vicinity of its ends, and is positioned with respect to the plate-like substrate 44 by inserting the positioning pins 50a of the sealing machine into the positioning holes of the plate-like holder body 88 when the sealing process is performed in the sealing machine, as shown in FIGS. 7A to 7D.

The plate-like holder body 88 is formed with a plurality of circular openings 90 which are arranged and aligned with each other at the same regular intervals as the surrounding wall members 48 securely mounted on the plate-like substrate 44. As is apparent from FIGS. 18 and 19, the circular openings 90 are used to temporarily and mechanically hold a plurality of lid members 92 by the plate-like holder body 88.

In particular, similar to the first embodiment, the lid members 92 are made of a suitable thermosetting resin material, such as epoxy or the like, using a metal mold in which the plate-like holder body 88 is incorporated, but the metal mold is constituted such that each of the molded lid members 92 has a stub portion 92a integrally protruded from a top surface thereof, and a rectangular portion 92b bulged from a bottom surface thereof. Namely, during the molding process, the circular openings 90 are filled with the resin material. Thus, when the molding of the lid members 92 is completed, each of the stub portions 92a, which are integrally protruded from the top surfaces of the lid members 92, is closely fitted into a corresponding circular opening 90, whereby the lid members 92 are temporarily and mechanically held by the plate-like holder body 88. Namely, the temporary holding of the lid members 92 by the plate-like holder body 88 is achieved in substantially the same manner as in the aforesaid second embodiment.

In the eighth embodiment, each of the lid members 92 is not adhered to a corresponding surrounding wall member 48, but the bulged portion 92b is securely fitted in the top end opening of the surrounding wall member 48, as shown in FIG. 19. In particular, a size of the bulged-portion 92b is somewhat larger than a size of the top end opening of the surrounding wall member 92 at a usual ambient temperature, but the resin material of the lid members 86 has a coefficient of thermal expansion smaller that of the surrounding wall member 48. Thus, during the sealing process, the lid members 92 and the surrounding wall members 48 are heated by exposing them to a hot air blow, so that the bulged-portion 92b of each lid member 92 can be easily and loosely received the top end opening of a corresponding surrounding wall member 48.

After the receipt of the bulged-portions 92b of the lid members 92 in the top end opening of a corresponding surrounding wall member 48, the hot air blow is stopped, and the lid members 92 and the surrounding wall members 48 are cooled to the usual ambient temperature, whereby they are securely attached to each other in the interference fit manner. Thus, when the plate-like holder body 88 is lifted up by the pneumatic sucker 54, the plate-like holder body 88 can be separated from the lid members 92 securely coupled to the top end of the surrounding wall members 48.

Similar to the aforesaid second embodiment, in the eighth embodiment, at least one groove may be formed in an inner peripheral wall face of each circular opening 90 so as to be extended in a direction parallel to a central axis thereof, to thereby increase a contact area between the circular openings 90 and the stub portion 92a. Namely, by varying the contact area between contact area between the circular openings 90 and the stub portion 92a, it is possible to regulate a holding force with which the lid members 92 are held by the plate-like holder body 88. Also, although the openings 90 are circular, these openings may have another shape, such as a rectangle, a triangle, an oval or the like.

Similar to the seventh embodiment, it is possible to easily and properly set and determine the thermal expansion coefficients of the surrounding wall members 48 and the lid members 92, such that they can be securely coupled to each other in the interference fit manner.

Also, in the eighth embodiment, the lid members 92 may be made of a suitable metal material, such as molybdenum, tungsten or the like, which exhibits a relatively small coefficient of thermal expansion.

Figure 20:
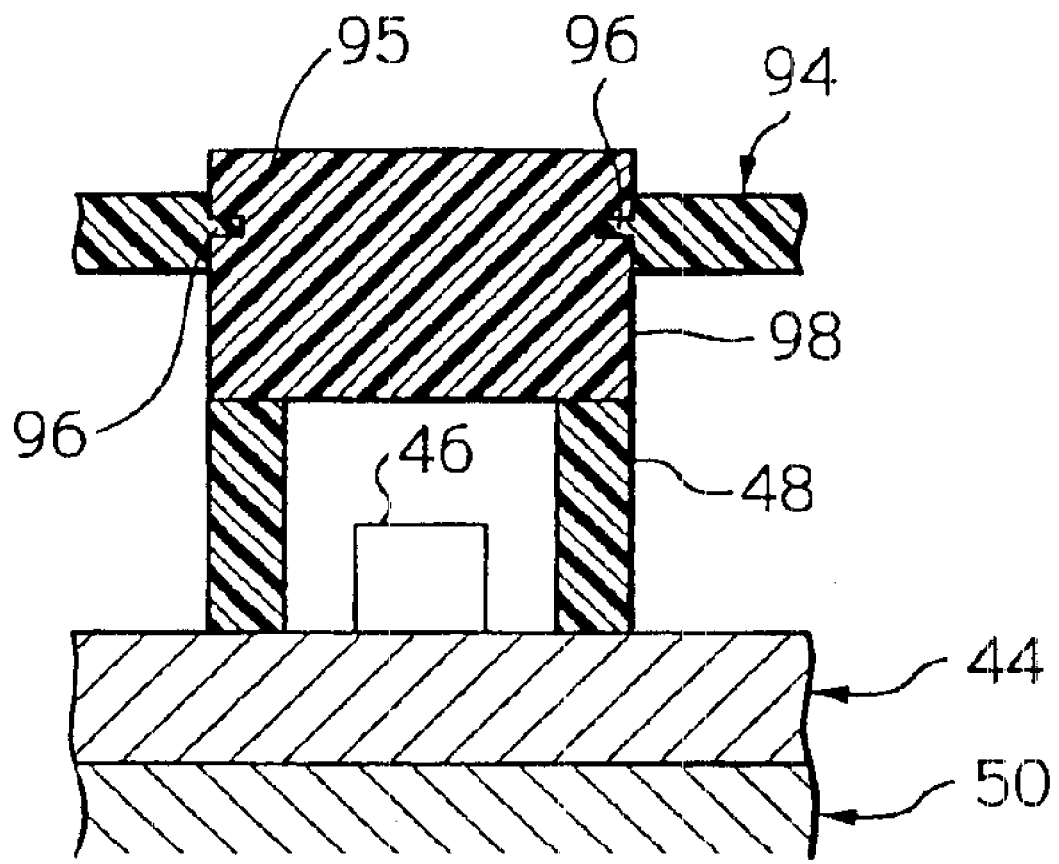
FIG. 20 is a schematic conceptual cross-sectional view, corresponding to a partially-enlarged view of FIG. 7C, showing a ninth embodiment of the lid-member holder according to the present invention.

With reference to FIG. 20, a ninth embodiment of the lid-member holder according to the present invention is partially shown. Note, this drawing also corresponds to a partially-enlarged view of FIG. 7C, and the features similar to those shown in FIG. 7C are indicated by the same references in FIG. 20.

In this ninth embodiment, the lid-member holder comprises a plate-like holder body 94 made of a suitable resin material such as polyimide. In FIG. 20, although not illustrated, the plate-like holder body 94 is formed with a pair of positioning holes arranged in the vicinity of its ends, and is positioned with respect to the plate-like substrate 44 by inserting the positioning pins 50a of the sealing machine into the positioning holes of the plate-like holder body 94 when the sealing process is performed in the sealing machine, as shown in FIGS. 7A to 7D.

The plate-like holder body 94 is formed with a plurality of circular openings 95 which are arranged and aligned with each other at the same regular intervals as the surrounding wall members 48 securely mounted on the plate-like substrate 44, and a plurality of radial needle elements 96 are integrally and inwardly protruded from an inner peripheral wall face of each circular opening 95. As is apparent from FIG. 20, the circular openings and the radial needle elements 96 are used to temporarily and mechanically hold a plurality of lid members 98 by the plate-like holder body 94.

In particular, similar to the first embodiment, the lid members 98 are made of a suitable thermosetting resin material, such as epoxy or the like, using a metal mold in which the plate-like holder body 94 is incorporated, but the metal mold is constituted such that each of the molded lid members 98 is mechanically engaged with the radial needle elements 96 of a corresponding circular opening 95. Namely, during the molding process, each of the circular openings 95 are filled with the resin material, so that the radial needle elements 96 are in mechanical engagement with the resin material. Thus, when the molding of the lid members 98 is completed, each of the molded lid members 98 are temporarily and mechanically held by the plate-like holder body 94.

In the ninth embodiment, a number of the radial needle elements 96 and a thickness of radial needle elements 96 are selected such that these radial needle elements 96 are easily broken when the plate-like holder body 94 is lifted up by the pneumatic sucker 54 after the adhesive agent intervened between the lid members 98 and the surrounding wall members 48 is completely cured. Namely, a force necessary to break the radial needle elements 96 is smaller than the adhesive force between the lid members 68 and the surrounding wall members 48, and thus it is possible to separate the plate-like holder body 94 from the lid members 98 securely adhered to the top end faces of the surrounding wall members 48.

In the above-mentioned embodiments, although the lid-member holders or plate-like holder bodies (34, 58, 64, 70, 74, 78, 82, 88, 94) are made of either the metal material or the resin material, any other suitable materials may be used for the plate-like holder bodies on condition that the lid members can be temporarily and properly held by the plate-like holder bodies. On the other hand, it is possible to use various suitable materials for the surrounding wall members 48, and the material of the lid members (36, 62, 68, 72, 76, 80, 86, 92, 98) should be determined, taking the material of the surrounding wall members into consideration.

Finally, it will be understood by those skilled in the art that the foregoing description is of preferred embodiments of the device, and that various changes and modifications may be made to the present invention without departing from the spirit and scope thereof.

What is claimed is:

1. A lid-member holder used to define envelopers having surrounding wall members encapsulating electronic components in production of hollow-package type electronic products, which comprises:
   a holder body; and
   a plurality of lid members temporarily held by said holder body,
   wherein said lid members and surrounding wall members align and register with one another,
   wherein said surrounding wall members are sealed with said lid members in a lump to define said envelopers,
   wherein the temporarily held lid members can be separated from the holder body after said surrounding wall members are completely sealed with said lid members.

2. A lid-member holder as set forth in claim 1, wherein said lid members are molded from a suitable resin material, using a metal mold in which said holder is incorporated, wherein the temporary holding of said lid members by said holder body is achieved when the molding of said lid members is completed.

3. A lid-member holder as set forth in claim 2, wherein a surface of said holder body is subjected to a rough surface treatment, and the molded lid members are in mechanical engagement with the treated surface of said holder body, whereby the temporary holding of said lid members by said holder body is achieved by the mechanical engagement between the molded lid members and the treated surface of said holder body.

4. A lid-member holder as set forth in claim 3, wherein said holder body is formed with a plurality of openings which are closed by said lid members, and a size of said openings is controlled to thereby regulate a holding force with which said lid members are held by said holder body.

5. A lid-member holder as set forth in claim 3, wherein a roughness of the treated surface of said holder body is controlled to regulate a holding force with which said lid members are held by said holder body.

6. A lid-member holder as set forth in claim 2, wherein said holder body is formed with a plurality of openings arranged so as to be consistent with the arrangement of said surrounding wall members, and each of the molded lid members has a stub portion which is in mechanical engagement with an inner peripheral wall surface of a corresponding one of said openings, whereby the temporary holding of said lid members by said holder body is achieved by the mechanical engagement between the molded lid members and the inner peripheral wall surfaces of said openings.

7. A lid-member holder as set forth in claim 6, wherein a contact area between one of said openings and the stub portion corresponding to each other is controlled to thereby regulate a holding force with which said lid members are held by said holder body.

8. A lid-member holder as set forth in claim 6, wherein each of said lid members further has a thin flange element integrally and radially extended from a top surface of the stub portion, and the respective stub portion with the thin flange elements are fitted into the openings wherein each of the thin flange elements is in close contact with a surface of the holder body, which surrounds one of said corresponding openings, whereby the temporary holding of said lid members by said holder body is achieved by the stub portions with the thin flange elements.

9. A lid-member holder as set forth in claim 8, wherein a thickness of said thin flange elements is controlled to thereby regulate a holding force with which said lid members are held by said holder body.

10. A lid-member holder as set forth in claim 2, wherein said holder body has a plurality of spike elements arranged so as to be consistent with the arrangement of said surrounding wall members, and each of the molded lid members is penetrated by one of said corresponding spike elements, whereby the temporary holding of said lid members by said holder body is achieved by the penetration of the spike elements into the molded lid members.

11. A lid-member holder as set forth in claim 10, wherein a configuration of the spike elements is controlled to thereby regulate a holding force with which said lid members are held by said holder body.

12. A lid-member holder as set forth in claim 2, wherein said holder body is made of a suitable resin material which is different from the resin material for said lid members, and the temporary holding of said lid members by said holder body is achieved by an adhesive force acting on interfaces between said holder body and said molded lid members.

13. A lid-member holder as set forth in claim 12, wherein a surface of said holder body is subjected to a rough surface treatment, and the molded lid members are in mechanical engagement with the treated surface of said holder body, whereby the temporary holding of said lid members by said holder body is further achieved by the mechanical engagement between the molded lid members and the treated surface of said holder body in addition to the adhesive force acting on the interfaces between said holder body and said molded lid members.

14. A lid-member holder as set forth in claim 13, wherein a roughness of the treated rough surface of said holder body is controlled to thereby regulate a holding force with which said lid members are held by said holder body.

15. A lid-member holder as set forth in claim 2, wherein said holder body is made of a suitable resin material, and is formed with a plurality of openings arranged so as to be consistent with the arrangement of said surrounding wall members, and a plurality of radial needle elements are integrally and inwardly protruded from an inner peripheral wall face of each of said openings wherein each of the molded lid members is mechanically engaged with the radial needle elements of one of said corresponding openings, whereby the temporary holding of said lid members by said holder body is achieved by the mechanical engagement between each molded lid member and the radial needle elements of each opening.

16. A lid-member holder as set forth in claim 15, wherein a number of the radial needle elements of each of said openings is controlled to thereby regulate a holding force with which said lid members are held by said holder body.

17. A lid-member holder as set forth in claim 15, wherein a thickness of said radial needle elements is controlled to thereby regulate a holding force with which said lid members are held by said holder body.

18. A lid-member holder as set forth in claim 1, wherein said lid members are made of a suitable material except for a resin material, and the temporary holding of said lid members by said holder body is achieved by adhering said lid members to said holder body with a suitable adhesive resin.

19. A lid-member holder as set forth in claim 1, wherein the sealing of respective said surrounding wall members with said lid members is achieved by adhering respective said lid members to said surrounding wall members with a suitable adhesive resin.

20. A lid-member holder as set forth in claim 1, wherein the sealing of respective said surrounding wall members with said lid members is achieved by coupling respective said lid members to said surrounding wall members in an interference fit manner.

21. A lid-member holder as set forth in claim 20, wherein each of said lid members is formed with a recess for receiving a top end of a corresponding surrounding wall member, a size of said recess being somewhat smaller than that of the top end of said surrounding wall member at a usual ambient temperature, and a material of said lid member has a coefficient of thermal expansion larger that of the surrounding wall member.

22. A lid-member holder as set forth in claim 20, wherein each of said lid members is formed with a bulged portion for inserting it into a top end opening of a corresponding surrounding wall member, a size of said bulged portion being somewhat larger than that of the top end opening of said surrounding wall member at a usual ambient temperature, and a material of said lid member has a coefficient of thermal expansion smaller that of the surrounding wall member.

23. A lid-member holder as set forth in claim 1, wherein each of said lid members is provided with an additional function which is obtained by processing said lid members in a lump, with the lid members being temporarily held by said holder body.

24. A lid-member holder asset forth in claim 23, wherein said additional function is an electromagnetic shield which is obtained from an electrically-conductive layer formed on each of the lid members.

25. A sealing process for sealing a plurality of surrounding wall members with a plurality of lid-members to define envelopers encapsulating electronic components in production of hollow-package type electronic products, which process comprises:

preparing an arrangement of said surrounding wall members;

preparing a holder body carrying said lid members temporarily held thereby;

positioning respective said lid members, held by said holder body, with respect to said surrounding wall members so as to be aligned and registered with each other;

attaching respective said lid members to said surrounding wall members in a lump to thereby seal said surrounding wall members with said lid members, resulting in the definition of said envelopers; and separating said holder body from said lid members after the completion of the sealing of said surrounding wall members with said lid members.

26. A lid-member holder as set forth in claim 25, wherein the sealing of surrounding said wall members with said lid members is achieved by adhering respective said lid members to surrounding said wall members with a suitable adhesive agent.

27. A lid-member holder as set forth in claim 25, wherein the sealing of surrounding said wall members with said lid members is achieved by coupling respective said lid members to surrounding said wall members in an interference fit manner.

* * * * *